United States Patent
Gronet et al.

(10) Patent No.: US 8,344,238 B2
(45) Date of Patent: Jan. 1, 2013

(54) SELF-CLEANING PROTECTIVE COATINGS FOR USE WITH PHOTOVOLTAIC CELLS

(75) Inventors: Chris M Gronet, Portola Valley, CA (US); James K. Truman, High Springs, FL (US)

(73) Assignee: Solyndra LLC, Fremont, CA (US)

( * ) Notice: Subject to any disclaimer, the term of this patent is extended or adjusted under 35 U.S.C. 154(b) by 1212 days.

(21) Appl. No.: 11/315,523

(22) Filed: Dec. 21, 2005

(65) Prior Publication Data

US 2007/0017567 A1 Jan. 25, 2007

Related U.S. Application Data

(60) Provisional application No. 60/700,982, filed on Jul. 19, 2005.

(51) Int. Cl.
H01L 25/00 (2006.01)
(52) U.S. Cl. ........ 136/243; 136/246; 502/309; 502/350; 428/421; 428/423.1
(58) Field of Classification Search .................. 136/243, 136/246; 502/309, 350; 428/421, 423.1
See application file for complete search history.

(56) References Cited

U.S. PATENT DOCUMENTS

| | | | |
|---|---|---|---|
| 2,984,775 A | 5/1961 | Matlow et al. |
| 3,005,862 A | 10/1961 | Escoffery |
| 3,046,324 A | 7/1962 | Matlow |
| 3,976,508 A | 8/1976 | Mlavsky |
| 3,990,914 A | 11/1976 | Weinstein et al. |
| 4,078,944 A | 3/1978 | Mlavsky |
| 4,113,531 A | 9/1978 | Zanio et al. |
| 4,217,148 A | 8/1980 | Carlson |
| 4,292,092 A | 9/1981 | Hanak |
| 4,686,323 A | 8/1987 | Biter et al. |
| 4,783,373 A | 11/1988 | Baumeister et al. |
| 4,913,744 A | 4/1990 | Hoegl et al. |
| 5,344,496 A | 9/1994 | Stern et al. |
| 5,437,736 A | 8/1995 | Cole |
| 5,902,416 A | 5/1999 | Kern et al. |
| 5,990,413 A | 11/1999 | Ortabasi |
| 6,013,372 A | 1/2000 | Hayakawa et al. |
| 6,107,564 A | 8/2000 | Aguilera et al. |

(Continued)

FOREIGN PATENT DOCUMENTS

DE 32 09 548 3/1982
(Continued)

OTHER PUBLICATIONS

Luigi Cassar, 1998, "Photocatalysts of Cementitious Materials: Clean Buildings and Clean Air," Mrs. Bulletin, May 2004: 328-331.

(Continued)

*Primary Examiner* — Xiuyu Tai
(74) *Attorney, Agent, or Firm* — Morgan, Lewis & Bockius LLP

(57) ABSTRACT

Systems and materials to improve photovoltaic cell efficiency by implementing a self-cleaning function on photovoltaic cells and on albedo surfaces associated with photovoltaic cell assemblies are provided. Materials for protecting albedo surfaces that surround photovoltaic cell assemblies, thereby maximizing energy input into the photovoltaic cell assemblies, are provided. Materials for self-cleaning photovoltaic cell panels, thereby maintaining their efficiency, are provided. Portable albedo collecting devices associated with photovoltaic cell assemblies are provided.

18 Claims, 7 Drawing Sheets

U.S. PATENT DOCUMENTS

| | | | |
|---|---|---|---|
| 6,165,256 A | 12/2000 | Hayakawa et al. | |
| 6,217,999 B1 | 4/2001 | Zhang et al. | |
| 6,238,738 B1 | 5/2001 | McCurdy | |
| 6,258,620 B1 | 7/2001 | Morel et al. | |
| 6,274,890 B1* | 8/2001 | Oshio et al. | 257/98 |
| 6,291,762 B1 | 9/2001 | Jan et al. | |
| 6,294,723 B2 | 9/2001 | Uematsu et al. | |
| 6,303,229 B2 | 10/2001 | Takahama et al. | |
| 6,337,129 B1* | 1/2002 | Watanabe et al. | 428/328 |
| 6,352,758 B1 | 3/2002 | Huang et al. | |
| 6,355,873 B1 | 3/2002 | Ishikawa | |
| 6,359,210 B2 | 3/2002 | Ho et al. | |
| 6,410,843 B1 | 6/2002 | Kishi et al. | |
| 6,413,581 B1 | 7/2002 | Greenberg et al. | |
| 6,447,123 B2 | 9/2002 | Tonar et al. | |
| 6,455,465 B1 | 9/2002 | Miyasaka | |
| 6,524,664 B1 | 2/2003 | Hashimoto et al. | |
| 6,537,379 B1 | 3/2003 | Vajo et al. | |
| 6,548,751 B2 | 4/2003 | Sverdrup, Jr. et al. | |
| 6,555,739 B2 | 4/2003 | Kawam | |
| 6,569,520 B1 | 5/2003 | Jacobs | |
| 6,645,569 B2 | 11/2003 | Cramer et al. | |
| 6,673,433 B1 | 1/2004 | Saeki et al. | |
| 6,679,978 B2 | 1/2004 | Johnson et al. | |
| 6,680,040 B1 | 1/2004 | Nishida et al. | |
| 6,680,135 B2 | 1/2004 | Boire et al. | |
| 6,692,794 B2 | 2/2004 | Nakamura et al. | |
| 6,706,959 B2 | 3/2004 | Hamakawa et al. | |
| 6,706,963 B2 | 3/2004 | Gaudiana et al. | |
| 6,716,513 B1 | 4/2004 | Hasuo et al. | |
| 6,762,359 B2 | 7/2004 | Asai et al. | |
| 6,777,091 B2 | 8/2004 | Kijima et al. | |
| 6,806,414 B2 | 10/2004 | Shiotsuka et al. | |
| 6,811,884 B2 | 11/2004 | Goodwin et al. | |
| 6,816,297 B1 | 11/2004 | Tonar et al. | |
| 6,830,785 B1 | 12/2004 | Hayakawa et al. | |
| 6,840,061 B1 | 1/2005 | Hurst et al. | |
| 6,846,512 B2 | 1/2005 | Rohrbaugh et al. | |
| 6,846,556 B2 | 1/2005 | Boire et al. | |
| 6,863,933 B2 | 3/2005 | Cramer et al. | |
| 6,866,937 B2 | 3/2005 | Honjo et al. | |
| 6,872,444 B2 | 3/2005 | McDonald et al. | |
| 6,881,505 B2 | 4/2005 | Tixhon | |
| 6,881,701 B2 | 4/2005 | Jacobs | |
| 6,884,753 B2 | 4/2005 | Sakatani et al. | |
| 6,890,645 B2 | 5/2005 | Disse et al. | |
| 6,902,653 B2 | 6/2005 | Carmignani et al. | |
| 6,921,579 B2 | 7/2005 | O'Shaughnessy et al. | |
| 6,929,862 B2 | 8/2005 | Hurst et al. | |
| 6,940,008 B2 | 9/2005 | Shiotsuka et al. | |
| 6,971,948 B2 | 12/2005 | Valek et al. | |
| 6,974,611 B2 | 12/2005 | Sakatani et al. | |
| 2002/0130311 A1 | 9/2002 | Lieber et al. | |
| 2002/0180909 A1 | 12/2002 | Lubart et al. | |
| 2003/0121544 A1 | 7/2003 | Hirata et al. | |
| 2004/0063320 A1 | 4/2004 | Hollars | |
| 2005/0040374 A1 | 2/2005 | Chittibabu et al. | |
| 2005/0049158 A1* | 3/2005 | Cai | 510/197 |
| 2005/0098202 A1 | 5/2005 | Maltby, Jr. | |
| 2006/0086384 A1 | 4/2006 | Nakata | |
| 2006/0185714 A1 | 8/2006 | Nam et al. | |

FOREIGN PATENT DOCUMENTS

| | | |
|---|---|---|
| DE | 43 39 547 | 11/1993 |
| DE | 43 43 514 | 12/1993 |
| DE | 44 06 760 | 3/1994 |
| DE | 197 32 876 | 7/1997 |
| FR | 75 30980 | 10/1975 |
| JP | 59-125670 | 7/1984 |
| JP | 59-143377 | 8/1984 |
| JP | 59-144177 | 8/1984 |
| JP | 10 212 809 A | 8/1998 |
| WO | WO 84/04425 | 11/1984 |
| WO | WO 97/23572 | 12/1996 |
| WO | WO 98/41480 | 9/1998 |
| WO | WO 99/05231 A | 2/1999 |
| WO | WO 00/75087 A | 12/2000 |
| WO | WO 02/45143 A1 | 6/2002 |
| WO | WO 03/049201 A1 | 6/2003 |
| WO | WO 2005/034149 A2 | 4/2004 |
| WO | WO 2004/061417 A2 | 7/2004 |
| WO | WO 2004/100252 A1 | 11/2004 |
| WO | WO 2005/056870 A | 6/2005 |
| WO | WO 2005/071760 A1 | 8/2005 |
| WO | WO 2006/015430 A1 | 2/2006 |
| WO | PCT/2006/028103 | 7/2006 |

OTHER PUBLICATIONS

Almonacid et al., 1987, "Analysis of a Photovoltaic Static Concentrator Prototype," Solar & Wind Technology 4: 145-149.

Almonacid et al., 1984, "Photovoltaic Static Concentrator Analysis," Solar Cells 13: 163-178.

Basu et al., 1991, "Field Studies of Performance & Relability of Heterogeneous Photo-Voltaic Modules of Optimum Array Design," IEEE: 689-694.

Birkmire et al., 2005, "Cu(InGa)Se$_2$ Solar Cells on a Flexible Polymer Web," Prog. Photovolt 13: 141-148.

Blaker et al., 2004, "Bright Future for Sliver Cell Technology," PEI Magazine; 26-30.

Bube, 1998, "Photovoltaic Materials," Properties of Semiconductor Materials 1: 1-277.

Calleja et al., 1983, "Bifacial Cell of p+in+Behavior," IEEE Mediterranean Electrotechnical Conference 2.

Chaisitak et al., 2000, "Improvement in Performances of ZnO:B/i-ZnO/Cu(InGa)Se$_2$ Solar Cells by Surface Treatments for Cu(InGa)Se$_2$," The Japan Society of Applied Physics 39: 1660-1664.

Chieng et al., 1993, "Computer Simulation of Enhanced Output from Bifacial Photovoltaic Modules," Progress in Photovoltaics: Research and Application 1: 293-299.

Chevalier et al., 1979, "Advances in Theory, Fabrication and Applications of Bifacial Solar Cells," $2^{nd}$ E.C. Photovoltaic Solar Energy Conference: 817-823.

Collares-Pereira et al., 1989, "Amorphous Silicon Photovoltaic Solar Cells—Inexpensive, High-Yield Optical Designs," ASME 111: 112-116.

Collares-Pereira et al., 1986, "A Novel Combination of Low Concentration CPC Collectors with Bifacial Photovoltaic Cells," Seventh E.C. Photovoltaic Solar Energy Conference: 1226-1228.

Cuevas et al., 1982, "50 Per Cent More Output Power from an Albedo-collecting Flat Panel Using Bifacial Solar Cells," Solar Energy 29: 419-420.

Delahoy et al., 2004, "New technologies for CIGS photovoltaics," Solar Energy 77: 785-793.

Dhere et al., 2004, "Large area CIGS2 thin film solar cells on foils: nucleus of a pilot plant," Solar Energy 77: 697-703.

Edmonds, 1990, "The Performance of Bifacial Solar Cells in Static Solar Concentrators," Solar Energy Materials 21: 173-190.

Fernandez et al., 2005, "Photoelectrochemical characterization of the Cu(in,Ga)S$_2$ thin film prepared by evaporation," Solar Energy Materials & Solar Cells 85: 251-259.

Feteha et al., 2001, "Optimum design for bifacial silicon solar cells," Renewable Energy 22: 269-274.

Harding et al., 1979, "Production and Properties of Selective Surfaces Coated Onto Glass Tubes by a Magnetron Sputtering System," Sun II Proceedings of the International Solar Energy Society 3: 1912-1916.

Harding, 1977, "Improvements in a dc reactive sputtering system for coating tubes," J. Vac. Sci. Technol., 14: 1313-1315.

Herz et al., 2005, "CIGS Solar Modules Contacted by Conducting Adhesives and Ultrasonic Welding," $20^{th}$ European Photovoltaic Solar Energy Conference, Barcelona, Spain: 1910-1913.

Hoshi et al., 1983, "Thin Film Coating Techniques on Wires and Inner Walls of Small Tubes via Cylindrical Magnetron Sputtering," Electrical Engineering in Japan 103: 16-22.

Inazu et al., 2005, "Cu(In,Al)S$_2$ Thin Film Solar Cell," Japanese Journal of Applied Physics 44: 1204-1207.

Jaeger et al., 1993, "Performance of Bifacial Mis-inversion Layer Solar cells Encapsulated in Novel Albedo Collecting Modules," Proc $7^{th}$ European Phtov. Solar Energy Conf., Sevilla, p. 806 (1986): 1235-1239.

Jebaraj et al., 2004, "A review of energy models," Renewable and Sustainable Energy Reviews 10: 281-311.

Jensen et al., 2003, "Back Contact Cracking During Fabrication of CIGS Solar Cells on Polyimide Substrates," NREL/CD, 877-881.

Joge et al., 2002, "Applications and Field Tests of Bifacial Solar Modules," IEEE: 1549-1552.

Joliet et al., 1985, "Laser-induced Synthesis of Thin $CuInSe_2$ Films," Appl. Phys. Lett. 46: 266-267.

Kerr et al., 2004, "Reliability Testing of Sliver Modules and Effects of Partial Shading on Power Output," Sliver Reliable Testing, Electron Device Letters 25, 37.

Khosrofian et al., 1983, "Measurement of a Gaussian Laser Beam Diameter Through the Direct Inversion of Knife-edge Data," Applied Optics 22: 3406-3410.

Krenzinger et al., 1986, "Estimation of Radiation Incident on Bifacial Albedo-Collecting Panels," Int. J. Solar Energy 4: 297-319.

Krenzinger et al., 1985, "Albedo Collection for Bifacial Photovoltaic Panels, (A Study of Many Practical Configurations)," $6^{th}$ E.C. Photovoltaic Solar Energy Conference: 397-401.

Lifante et al., 1982, "Luminescent Solar Concentrators as Bifacial Captors," Solar Cells 8: 355-360.

Lincoln et al., 1980, "Adapting conventional sputtering equipment for coating long tubes and strips," J. Vac. Sci. Technol. 17: 1252-1253.

Pantoja-Lopez et al., 1986, "100 kWp Experimental Photovoltaic Solar Power Plant," SunWorld 10: 17-20.

Lorenzo et al., 1984, "Experimental Comparison Between Several Photovoltaic Panels, Regarding the Solar Energy Collection," $17^{th}$ IEEE Photovoltaic Specialists Conference: 1066-1069.

Lugue, 1984, "Static Concentrators: A Venture to Meet the Low Cost Target in Photovoltaics," Solar Cells 12: 141-145.

Lugue, 1984-1985, "Diffusing Reflectors for Bifacial Photovoltaic Panels," Solar Cells 13: 277-292.

Lugue et al., 1980, "New Concepts for Static Concentration of Direct and Diffuse Radiation," $3^{rd}$ E.C. Photovoltaic Solar Energy Conference: 396-400.

Lugue et al., 1983, "Albedo Collection in Bifacial Panels," Solar Energy and the Arab World First Arab International Solar Energy Conference, Kuwait, Dec. 2-8, 1983: 226-230.

Lugue et al., 2003, "Handbook of Photovoltaic Science and Engineering," Wiley, 1-662.

Malbranche et al., Winter 2000-2001, "The Three Ways to Exploit Solar Energy," CLEFS CEA No. 44: 25-37.

Miyazaki et al., 2004, "Efficiency Improvement of $Cu(inGa)Se_2$ Thin Film Solar Cells with a High Ga Composition Using Rapid Thermal Annealing," Japanese Journal of Applied Physics 43: 4244-4247.

Mauk et al., 2003, "Deposition, Recrystallization, and Epitaxy of Silicon, Germanium, and GaAs on Fibers and Methal Wires for Optoelectronic Device Applications," Materials Research Society 736: 127-132.

Miñano et al., 1983, "Limit of concentration under extended nonhomogeneous light sources," Applied Optics 22: 2751-2760.

Miñano et al., 1986, "Small Concentrators for Photovoltaic Static Concentration Applications," $7^{th}$ E.C. Photovoltaic Solar Energy Conference: 890-894.

Miñano 1984, "Design of Static Concentrators wit hthe Receiver Immersed in a Dielectric Tube," $1^{st}$ E.C. Conference on Solar Heating: 599-603.

Abdel-Motaleb et al., 1983, "Theory of Rod and Half Rod Concentrator Solar Cells," $5^{th}$ E.C. Photovoltaic Solar Energy Conference: 250-256.

Moehlecke et al., 1991, "Modules Assembled with Diffuse Reflectors for Photovoltaic Bifacial Cells," $10^{th}$ European Photovolatic Solar Energy Conference 967-970.

Nakada et al., 2004, "Novel device structure for $Cu(in,Ga)Se^2$ thin film solar cells using transparent conducting oxide back and front contacts," Solar Energy 77: 739-747.

Oria et al., 1988, "A Good Combination: Tracking of the Sun in Polar Axis and Bifacial Photovoltaic Modules," Solar & Wind Technology 5: 629-636.

Ortabasi et al., 1988, "An Evaluation of Some Generic Low Concentration of PV Modules Utilizing a Novel Bifacial Solar Cell," $8^{th}$ E.C. Photovoltaic Solar Energy Conference: 310-314.

Ortabasi et al., 1988, "Low Concentration Photovoltaic Module Design Using Bifacial Solar Cells," $20^{th}$ IEEE Photovoltaic Specialists Conference: 1324-1326.

Ortabasi, 1997, "Performance of a 2x Cusp Concentrator PV Module Using Bifacial Solar Cells," IEEE, $26^{th}$ PVSC, Sep. 30-Oct. 3, 1997; Anaheim, California: 1177-1181.

Otoma et al., 1991, "Growth of $CuGaS_2$ by Alternating-source-feeding MOVPE," Journal of Crystal Growth 115: 807-810.

Pandy et al., 1996, "Handbook of Semiconductor Electrodeposition," Applied Physics: 1-285.

Parada et al., 1991, "Construction and Measurement of a Prototype of P.V. Module With Static Concentration," $10^{th}$ E.C. Photovoltaic Solar Energy Conference: 975-978.

Pearce, 1970, "A Thick Film Vacuum Deposition System for Microwave Tube Component Coating," Papers presented at the United Engineering Center—NYC, Sep. 23-24, 1970, IEEE Conference Record of 1970 Conference on Electron Device Techniques: 208-211.

Photon International 2004—The Photovoltaic Magazine, "Saving with slivers": 29-31.

Proskurkin et al., 1993, "New Types of Zinc-Aluminum Alloy Coatings and Methods of Depositing Them on Rolled Products and Pipes," International Standard Serial No. 23: 36-39.

Rojahn et al., 2001, "Photovoltaics on Wire," Materials Research Society 664: A2.1.1-A2.1.6.

Romeo, 2002, "Growth and Characterization of High Efficiency CdTe/CDS Solar Cells," Dissertation submitted to the Swiss Federal Institute of Technology Zurich: 1-103.

Roussillon et al., 2004, "Back contact and reach-through diode effects in thin-film photovoltaics," Journal of Applied Physics 96: 7283-7288.

Sala, et al., 1984, "Performance of an Albedo Collecting Bifacial Flat Module," $17^{th}$ IEEE Photovoltaic Specialists Conference: 507-512.

Sala et al., 1983, "Measured Values of the Effective Efficiency of Albedo Collecting Flat Bifacial Panels," IEEE Mediterranean Electrotechnical Conference 2: D10.09.

Sala et al., 1983, "Albedo Collecting Photovoltaic Module," IEEE Mediterranean Electrotechnical Conference 2: D10.08.

Sala et al., 1983, "Albedo Collecting Photovoltaic Panels," $5^{th}$ E.C. Photovoltaic Solar Energy Conference: 565-569.

Sang et al., 2001, "Performance Improvement of CIGS-based Modules by Depositing High-quality Ga-doped ZnO Windows with Magnetron Sputtering," Solar Energy Materials & Solar Cells 67: 237-245.

Scheidt et al., 2004, "Optical second harmonic imaging of zinc oxide thin films grown by metal organic chemical vapour deposition (MOCVD)," Phys. Stat. Sol. (c) 1: 2243-2249.

Simpson et al., 2004, "Manufacturing Process Advancements for Flexible CIGS PV on Stainless Foil," Department of Energy Solar Program Review Meeting Oct. 25-28.

Stanbery, 2002, "Copper Indium Selenides and Related materials for Photovoltaic Devices," Critical Reviews in Solid State and Materials Sciences, 27(2): 73-117.

Stock et al., "Sliver Cell Prior Art Review," Mar. 5, 2006 dialog search: 1-3.

Stolt et al., 1994, "CIS Solar Cells with ZnO Windows Deposited by ALE," Photovoltaic Energ yConversion, 1994., Conference Record of the IEEE Photovoltaic Specialists Conference—1984: 250-253.

Tsidulko, 1989, "Matrix Solar Cell with Built-In Radiation Concentrator," Geliotekhnika 25:1: 27-30.

Uematsu et al., 2001, "Design and Characterization of Flat-Plate Static-Concentrator Photovoltaic Modules," Solar Energy Materials & Solar Cells 67:441-448.

Uematsu et al., 2001, "Fabrication and Characterization of a Flat-Plate Static-Concentrator Photovoltaic Module," Solar Energy Materials & Solar Cells 67:425-434.

Verlinden et al., 2005, "Update on Sliver Solar Cell Technology and Modules," $31^{st}$ IEEE Photovoltaic Specialist Conference, Orlando: 1007-1010.

Weber et al., 2005, "Sliver® Solar Cells," $31^{st}$ IEEE Photovoltaic Specialist Conference, Orlando: 991-994.

Weber et al., 2004, "The Effect of Bifacial Sliver® Module Orientation of Energy Production," IEEE Electron Device Letters 25 37.

Weber et al., 2003, "Modelling of Sliver® Modules Incorporating a Lambertian Rear Reflector," 3$^{rd}$ World Conference on Photovoltaic Solar Energy Conversion; http://hdl.handle.net/1885/42615.

Yoon et al., 2004, "Characterization of a Molybdenum Electrode Deposited by Sputtering and Its Effect on Cu(in,Ga)Se$^2$ Solar Cells," Journal of the Korean Physical Society 45: 1114-1118.

Young et al., 2002, "A New Thin-Film CuGase2/Cu(In,Ga)Se$_2$ Bifacial, Tandem Solar Cell With Both Junctions Formed Simultaneously," 29$^{th}$ IEEE PV Specialists Conference—New Orleans, Louisiana May 20-24, 2002: 608-611.

Lambin et al., 1983, "Complete calculation of the electric potential produced by a pair of current source and sink energizing a circular finite-length cylinder$^{a)}$," J. Appl. Phys. 54(7): 4174-4184.

Rabl, 1981, "Yearly Average Performance of the Principal Solar Collector Types," Solar Energy vol. 27. No. 3: 215-233.

Oria et al., 1985, "Improvement of the Albedo Collecting Effect by Varying the Rotation Axis in a Bifacial Polar Tracker," Proc. Melecon vol. IV: 125-128.

Sala et al., 1983, "Albedo Collecting Photovoltaic Bifacial Panels," 5$^{th}$ E.C. Photovoltaic Solar Energy Conference, Athens, Greece: 565-567.

"Tangram Technology Ltd.—Polymer Data File—PMMA" website, http:www.tangram.co.uk/T1-Polymer-PMMA.html from Jan. 12, 2002. Available from www.archive.org. 7 pages.

Trupke, T. et al., "Improving solar cell efficiencies by down-conversion of high-energy photons" J. Appl. Phys. 92, 1668-1674.

* cited by examiner

SELF-CLEANING PROTECTIVE COATINGS FOR USE WITH PHOTOVOLTAIC CELLS

CROSS REFERENCE TO RELATED APPLICATIONS

This Application claims priority to United States provisional patent Application No. 60/700,982, filed Jul. 19, 2005, which is hereby incorporated herein by reference in its entirety.

1. FIELD OF INVENTION

This invention generally relates to photovoltaic cell assemblies for converting photovoltaic energy into electrical energy and more particularly to improved photovoltaic cell energy conversion by maintaining the high albedo of the surrounding environment of photovoltaic cells.

2. BACKGROUND OF THE INVENTION

Interest in photovoltaic cells, also known as solar cells, has grown rapidly in the past few decades. Photovoltaic cells comprise semiconductor junctions such as p-n junctions. It is known that light with photon energy greater than the band gap of an absorbing semiconductor layer in a semiconductor junction is absorbed by the layer. Such absorption causes optical excitation and the release of free electrons and free holes in the semiconductor. Because of the potential difference that exists at a semiconductor junction (e.g., a p-n junction), these released holes and electrons move across the junction in opposite directions and thereby give rise to flow of an electric current that is capable of delivering power to an external circuit. The flow of carriers into the external circuit constitutes an electrical current density, J amp cm$^{-2}$, which, under short-circuit conditions, is known as the short-circuit current density, $J_{sc}$. At the same time, the separation of the charges (holes and electrons) sets up a potential difference between the two ends of the material, φ, which under open circuit conditions is known as the open-circuit voltage, $φ_{oc}$. It is desirable to maximize both $J_{sc}$ and $φ_{oc}$. For interaction with the solar spectrum, $J_{sc}$ and $φ_{oc}$ are optimized when the junction semiconductor absorber has a band gap of about 1.4 electron volts (eV).

It is presently common practice to provide an array of photovoltaic cells to generate electrical energy from solar radiation. Many photovoltaic cells are made of silicon. However, cells made of other materials, e.g., cadmium sulfide and gallium arsenide, have also been developed and tested. Crystalline silicon has traditionally been a favored material since it has a band gap of approximately 1.1 eV and thus favorably responds to the electromagnetic energy of the solar spectrum. However, because of the expense in making crystalline silicon-based cells, thin film photovoltaic cells made of materials other than silicon have been explored and used.

Presently, many photovoltaic cells are fabricated as separate physical entities with light gathering surface areas on the order of 4-6 cm$^2$ or larger. For this reason, it is standard practice for power generating applications to mount the cells in a flat array on a supporting substrate or panel so that their light gathering surfaces provide an approximation of a single large light gathering surface. Also, since each cell itself generates only a small amount of power, the required voltage and/or current is realized by interconnecting the cells of the array in a series and/or parallel matrix.

2.1 Photovoltaic Cell Mechanism and Structure

The structure of a conventional prior art photovoltaic cell panel is shown in FIG. 1. Because of the large range in the thickness of the different layers, they are depicted schematically. Moreover, FIG. 1 is highly schematized so that it will represent the features of both "thick-film" photovoltaic cells and "thin-film" photovoltaic cells. In general, photovoltaic cells that use an indirect band gap material to absorb light are typically configured as "thick-film" photovoltaic cells because a thick film of the absorber layer is required to absorb a sufficient amount of light. Photovoltaic cells that use direct band gap materials to absorb light are typically configured as "thin-film" photovoltaic cells because only a thin layer of the direct band-gap material is need to absorb a sufficient amount of light.

The arrows at the top of FIG. 1 show the direction of the solar illumination on the cell. Layer (element) 102 is the substrate. Glass or metal is a common substrate. In thin-film photovoltaic cells, substrate 102 can be-a polymer-based backing, metal, or glass. In some instances, there is an encapsulation layer, not shown, coating substrate 102. Layer 104 is the back electrical contact for the photovoltaic cell. It makes ohmic contact with the absorber layer of semiconductor junction 106.

Layer 106 is the semiconductor absorber layer. In many but not all cases, it is a p-type semiconductor. Absorber layer 106 is thick enough to absorb light. Layer 108 is the semiconductor junction partner-that completes the formation of a p-n junction, which is a common type of junction found in photovoltaic cells. In a photovoltaic cell based on a p-n junction, when absorber 106 is a p-type doped material, junction partner 108 is an n-type doped material. Conversely, when layer 106 is an n-type doped material, layer 108 is a p-type doped material. Generally, junction partner 108 is much thinner than absorber 106. For example, in some instances junction partner 108 has a thickness of about 0.05 microns. Junction partner 108 is highly transparent to solar radiation. Junction partner 108 is also known as the window layer, since it lets the light pass down to absorber layer 106.

In a typical thick-film photovoltaic cell, layers 106 and 108 can be made from the same semiconductor material but have different carrier types (dopants) and/or carrier concentrations in order to give the two layers their distinct p-type and n-type properties. In thin-film photovoltaic cells in which copper-indium-gallium-diselenide (CIGS) is absorber layer 106, the use of CdS to form layer 108 has resulted in high efficiency cells. Other materials that can be used for layer 108 include, but are not limited to, $SnO_2$, ZnO, $ZrO_2$ and doped ZnO.

Layer 110 is the top transparent electrode, which completes the functioning cell. Layer 110 is used to draw current away from the junction since junction partner 108 is generally too resistive to serve this function. As such, layer 110 should be highly conductive and transparent to light. Layer 110 can in fact be a comb-like structure of metal printed onto layer 108 rather than forming a discrete layer. Layer 110 is typically a transparent conductive oxide (TCO) such as zinc oxide (ZnO), indium-tin-oxide (ITO), or tin oxide ($SnO_2$). However, even when a TCO layer is present, a bus bar network 114 is typically needed to draw off current since the TCO has too much resistance to efficiently perform this function in larger photovoltaic cells. Network 114 shortens the distance charger carriers must move in the TCO layer in order to reach the metal contact, thereby reducing resistive losses. The metal bus bars, also termed grid lines, can be made of any reasonably conductive metal such as, for example, silver, steel or aluminum. There is design a tradeoff in network 114 between thicker grid lines that are more electrically conductive but block more light, and thin grid lines that are less electrically conductive but block less light. The metal bars are preferably configured in a comb-like arrangement to permit light rays through TCO layer 110. Bus bar network layer 114 and TCO layer 110, combined, act as a single metallurgical unit, functionally interfacing with a first ohmic contact to form a current collection circuit. In U.S. Pat. No. 6,548,751 to Sverdrup et al., which is hereby incorporated herein by reference in its entirety, a combined silver (Ag) bus bar network and indium-tin-oxide layer function as a single, transparent ITO/Ag layer.

Layer 112 is an antireflection (AR) coating, which can allow a significant amount of extra light into the cell. Depending on the intended use of the cell, it might be deposited directly on the top conductor (as illustrated), or on a separate cover glass, or both. Ideally, the AR coating reduces the reflection of the cell to very near zero over the spectral region that photoelectric absorption occurs, and at the same time increases the reflection in the other spectral regions to reduce heating. U.S. Pat. No. 6,107,564 to Aguilera et al., which is hereby incorporated herein by reference in its entirety, describes representative antireflective coatings that are known in the art.

Photovoltaic cells typically produce only a small voltage. For example, silicon based photovoltaic cells produce a voltage of about 0.6 volts (V). Thus, photovoltaic cells are interconnected in series or parallel in order to get a reasonable voltage. When connected in series, voltages of individual cells add together while current remains the same. Thus, photovoltaic cells arranged in series reduce the amount of current flow through such cells, compared to analogous photovoltaic cells arrange in parallel, thereby improving efficiency. As illustrated in FIG. 1, the arrangement of photovoltaic cells in series is accomplished using interconnects 116. In general, an interconnect 116 places the first electrode of one photovoltaic cell in electrical communication with the counterelectrode of an adjoining photovoltaic cell.

As noted above and as illustrated in FIG. 1, conventional photovoltaic cells are typically in the form of a plate structure. Although such cells are highly efficient when they are smaller, larger planar photovoltaic cells have reduced efficiency because it is harder to make the semiconductor films that form the junction in such photovoltaic cells uniform. Furthermore, the occurrence of pinholes and similar flaws increase in larger planar photovoltaic cells. These features can cause shunts across the junction. Detailed descriptions of various types of photovoltaic cells within the scope of the present invention, as defined by junction type, are in Section 5.4, below.

2.2 Albedo Energy and Photovoltaic Cells

Regardless of their difference in set-up and physical shape, photovoltaic cells function by converting solar radiation into electrical energy. Those skilled in the art will appreciate that the efficiency of a specific type of photovoltaic cell is proportional to the amount of photovoltaic radiation that is absorbed by the cell. Such absorption is influenced by numerous conditions including but not limited to cloud cover, location, geographic latitude, and time of the day. For example, an extremely cloudy day reduces the amount of photovoltaic radiation available for absorption by a photovoltaic cell system. In an effort to absorb more of the available photovoltaic radiation, workers have developed photovoltaic cell architectures such as the bi-facial photovoltaic array that has both a front and a back panel. U.S. Pat. No. 5,990,413 to Ortabasi et al. describes such photovoltaic cell panels. The goal of the bi-facial design is to take advantage of both direct solar radiation and albedo.

Albedo is the fraction of incident electromagnetic radiation reflected by a surface. Albedo measures the reflectivity of a surface or body. It is the ratio of electromagnetic radiation reflected to the amount incident upon it. This ratio is a percentage that ranges anywhere from zero percent to one hundred percent. The amount of albedo a material exhibits is a function of its physical properties. Albedo is a product of the reflection of the incident solar radiation by the surroundings of the photovoltaic cells, such as sand, snow, water, rocks, grass, and buildings. Albedo is strongly dependent upon the nature of the environment. For example, albedo due to fresh snow can be higher than seventy percent while albedo due to large bodies of water is less than ten percent. In some instances, enhanced albedo improves the efficiency of existing photovoltaic cell assemblies.

Using albedo to improve photovoltaic cell efficiency has been described. For example, U.S. Pat. No. 5,990,413 to Ortabasi et al. and U.S. Pat. No. 5,344,496 to Stern et al., each of which is hereby incorporated by reference in its entirety, describe bi-facial and concentrator photovoltaic cell array designs, respectively, that make use of the albedo affect. High albedo materials, however, are often difficult to maintain. The albedo properties of a high albedo material change as the physical properties of the material change. Unfortunately, the albedo properties of material degrade over time. For example, numerous factors, such as bacteria growth, dirt built up, and/or watermarks on the surface of the material can all deleteriously affect the albedo property of such material. Such degradation in the albedo affect of materials adversely affects the efficiency of photovoltaic cell assemblies that make use of the albedo effect to improve efficiency since the efficiency of such systems is a function, in part, of the strength of such albedo effects.

In the art, regular cleaning of albedo surfaces has been done in order to maintain the albedo properties of materials in the vicinity of solar cells. However, such regular cleaning of such materials, in order to maintain their albedo properties, is inconvenient, time consuming, and expensive. For example, many conventional photovoltaic cell assemblies have a large number of photovoltaic cell panels arranged into concentrated arrays to optimize their efficiency. Because of this compact arrangement, the albedo surfaces around such photovoltaic cells are difficult to access for cleaning purposes.

Furthermore, use of detergents to facilitate cleaning can have adverse effects on albedo surfaces that are sensitive to such chemicals. Reduced albedo effect can result from such cleaning. Moreover, some albedo surface cleaning regimens require the removal of photovoltaic cell panels prior to cleaning. Clearly, such efforts are costly and time consuming.

Some approaches to maintaining albedo surfaces involve repainting such surfaces with, for example, a highly reflective white paint. However, such approaches are inconvenient for many of the same reasons described above in relation to cleaning regimens. Such reasons include the difficulty in gaining access to such regions and the manual labor involved in painting. Further, this approach is not advantageous because it typically requires a cleaning prep stage, because of the expense of the paint used, and because, over time, an excessive buildup comprising multiple layers of paint form on the albedo surface that need to be stripped away in order to maintain the integrity of such surfaces.

Just as cleaning albedo surfaces is a necessary task in order to maintain the albedo properties of such surfaces, cleaning of photovoltaic cell panels themselves is necessary as well. However, such cleaning has the same drawbacks as the cleaning of albedo surfaces. Namely, such cleaning is time consuming, can degrade the material properties of the panels through adverse interaction (chemical, abrasive, or otherwise) with the cleaning agents, and is expensive. However, such cleaning may be necessary since any debris build up on photovoltaic cell panel surfaces adversely affects their efficiency.

Given the above background what are needed in the art are improved systems or methods for preserving the high albedo properties of albedo surfaces used in photovoltaic cell configurations. Moreover, what are needed in the art are improved systems and methods for cleaning photovoltaic cell panel surfaces.

3. SUMMARY OF THE INVENTION

To address the problems found in the prior art, the present invention provides systems and methods for maintaining the efficiency of photovoltaic cells. In particular, the present invention provides systems and methods for maintaining self-cleaning albedo surfaces and self-cleaning photovoltaic cell panels. Self-cleaning albedo surfaces and photovoltaic cell panels are produced by applying one or more layers of self-cleaning material onto the surface of photovoltaic cell panels as well as albedo surfaces. In this way, the drawbacks found in the prior art, namely laborious time consuming cleaning and repainting efforts, are minimized, thereby yielding a more efficient cost effective photovoltaic cell system.

One aspect of the invention provides a photovoltaic cell system comprising a plurality of photovoltaic cell assemblies. Each assembly in the plurality of photovoltaic cell assemblies comprises a front side. Each of these front sides is configured to receive electromagnetic energy. Each of the photovoltaic assemblies in the plurality of photovoltaic assemblies is configured to convert electromagnetic energy into an electrical current. The photovoltaic cell system further comprises an albedo surface configured to reflect electromagnetic energy on one or more photovoltaic cell assemblies in the plurality of photovoltaic cell assemblies. The albedo surface comprises a high albedo layer and a self-cleaning layer disposed on the high albedo layer.

In some embodiments, the self-cleaning layer comprises a photocatalytic material, Ti-hydroxyapetite, anatase $TiO_2$, brookitein $TiO_2$ or rutile $TiO_2$. In some embodiments, the self-cleaning layer comprises between 1 percent $TiO_2$ and 90 percent $TiO_2$ by weight. In some embodiments, the self-cleaning layer comprises ZnO, $SnO_2$, $SrTiO_3$, $WO_3$, $Bi_2O_3$, $Fe_2O_3$, TEFLON®, polytetrafluoroethylene or polychlorotrifluoroethylene. In some embodiments, the self-cleaning layer is formed from perotitanium solution or perox-modified anatase sol. In some embodiments, the self-cleaning layer comprises a plurality of nano-particles. Such nano-particles can comprise, for example $SiO_2$, $TiO_2$, $Al_2O_3$, $ZrO_2$ or $SnO_2$, silica, or any combination thereof. In some embodiments, the self-cleaning layer comprises $(100-X)CaF_2$ -$(X)TiO_2$, where X is the molar percentage of $TiO_2$ and X is between 1 percent and 50 percent. In some embodiments, the self-cleaning layer comprises a composite of $CaF_2$ and $TiO_2$. n-decyltriisopropoxysilane, n-decyl-tri-t-butoxysilane, n-octatrimethoxysilane, n-octatriethoxysilane, n-octatrichlorosilane, n-octatribromosilane, n-octatriisopropoxysilane, n-octa-tri-t-butoxysilane, phenyltrimethoxysilane, phenyltriethoxysilane, phenyltrichlorosilane, phenyltribromosilane, phenyltriisopropoxysilane, phenyl-t-butoxysilane, dimethyldichlorosilane, dimethyldibromosilane, dimethyldimethoxysilane, dimethyldiethoxysilane, diphenyldichlorosilane, diphenyldibromosilane, diphenyldimethoxysilane, diphenyldiethoxysilane, phenylmethyldichlorosilane, phenylmethyldibromosilane, phenylmethyldimethoxysilane, phenylmethyldiethoxysilane, vinyltrichlorosilane, vinyltribromosilane, vinyltrimethoxysilane, vinyltriethoxysilane, vinyltriisopropoxysilane, vinyl-tri-t-butoxysilane, trifluoropropyltrichlorosilane, trifluoropropyltribromosilane, trifluoropropyltrimethoxysilane, trifluoropropyltriethoxysilane, trifluoropropyltriisopropoxysilane, trifluoropropyl-tri-t-butoxysilane, γ-glycidoxypropylmethyldimethoxysilane, γ-glycidoxypropylmethyldiethoxysilane, γ-glycidoxypropyltrimethoxysilane, γ-glycidoxypropyltriethoxysilane, γ-glycidoxypropyltriisopropoxysilane, γ-glycidoxypropyl-tri-t-butoxysilane, γ-methacryloxypropylmethyldimethoxysilane, γ-methacryloxypropylmethyldiethoxysilane, γ-methacryloxypropyltrimethoxysilane, γ-methacryloxypropyltriethoxysilane, γ-methacryloxypropyltriisopropoxysilane, γ-methacryloxypropyl-tri-t-butoxysilane, γ-aminopropylmethyldimethoxysilane, γ-aminopropylmethyldiethoxysilane, γ-aminopropyltrimethoxysilane, γ-aminopropyltriethoxysilane, γ-aminopropyltriisopropoxysilane, γ-aminopropyl-tri-t-butoxysilane, γ-mercaptopropylmethyldimethoxysilane, γ-mercaptopropylmethyldiethoxysilane, γ-mercaptopropyltrimethoxysilane γ-mercaptopropyltriethoxysilane, γ-mercaptopropyltriisopropoxysilane, γ-mercaptopropyl-tri-t-butoxysilane, β-(3,4-poxycyclohexyl)ethyltrimethoxysilane, β-(3,4-epoxycyclohexyl) ethyltriethoxysilane, or any combination thereof Examples of fluororesin include, but are not limited to, polytetrafluoroethylene, polyvinylidene fluoride, polyvinyl fluoride, polychlorotrifluoroethylene, tetrafluoroethylene/hexafluoropropylene copolymer, ethylene/tetrafluoroethylene copolymer, ethylene/chlorotrifluoroethylene copolymer, tetrafluoroethylene/perfluoroalkyl vinyl ether copolymer, perfluorocyclo polymer, vinyl ether/fluoroolefin copolymer, vinyl ester/fluoroolefin copolymer, tetrafluoroethylene/vinyl ether copolymer, chlorotrifluoroethylene/vinyl ether copolymer, urethane-crosslinked tetrafluoroethylene, epoxy-crosslinked tetrafluoroethylene, acryl-crosslinked tetrafluoroethylene, melamine-crosslinked tetrafluoroethylene, or any combination thereof.

Another aspect of the invention provides a photovoltaic cell system comprising a plurality of photovoltaic cell assemblies. Each assembly in the plurality of photovoltaic cell assemblies comprises a base, a solar cell panel attached to the base, and a self-cleaning albedo device attached to the base. The self-cleaning albedo device comprises a flexible substrate, a high albedo layer, and a self-cleaning layer. The high albedo layer is disposed on the flexible substrate and the self-cleaning layer is disposed on the high albedo layer. In some embodiments, a photovoltaic cell system in accordance with this aspect of the invention comprises a retractable roller mounted on the base of an assembly in the plurality of photovoltaic assemblies for retracting the self-cleaning albedo device into a roll. In some embodiments, the self-cleaning albedo device has an open configuration and a closed configuration. The self-cleaning albedo device is rolled up in the retractable roller when the self-cleaning albedo device is in the closed position. The self-cleaning albedo device is extended in a downward gradient away from the base when the self-cleaning albedo device is in the open position.

In some embodiments, the self-cleaning layer comprises a photocatalytic material, Ti-hydroxyapetite, anatase $TiO_2$, rutile $TiO_2$ or brookitein $TiO_2$. In some embodiments, the self-cleaning layer comprises between 1 percent $TiO_2$ and 90 percent $TiO_2$ by weight. In some embodiments, the self-cleaning layer comprises ZnO, $SnO_2$, $SrTiO_3$, $WO_3$, $Bi_2O_3$, $Fe_2O_3$, TEFLON®, polytetrafluoroethylene or polychlorotrifluoroethylene. In some embodiments, the self-cleaning layer is formed from perotitanium solution or perox-modified anatase sol. In some embodiments, the self-cleaning layer comprises a plurality of nano-particles. Such nano-particles can comprise, for example $SiO_2$, $TiO_2$, $Al_2O_3$, $ZrO_2$ or $SnO_2$, silica, or any combination thereof. In some embodiments, the self-cleaning layer comprises $(100-X)CaF_2$ $-(X)TiO_2$, where X is the molar percentage of $TiO_2$ and X is between 1 percent and 50 percent. In some embodiments, the self-cleaning layer comprises a composite of $CaF_2$ and $TiO_2$.

Still another aspect of the present invention provides an albedo protective composite for use with photovoltaic cells. The albedo composite comprises a high albedo layer and a self-cleaning layer. In some embodiments in accordance with the present invention, the high albedo layer has an albedo value of twenty percent or greater, twenty-five percent or greater, thirty percent or greater, thirty-five percent or greater, forty percent or greater, forty-five percent or greater, fifty percent or greater, or fifty-five percent or greater. In other embodiments in accordance with the present invention, the high albedo layer has an albedo of sixty percent or greater, sixty-five percent or greater, seventy percent or greater, seventy-five percent or greater, eighty percent or greater, eighty-five percent or greater, ninety percent or greater or ninety-five percent or greater. The self-cleaning layer can be made of any of the materials described in relation to self-cleaning layers of other aspects of the invention described above.

4. BRIEF DESCRIPTION OF THE DRAWINGS

Like referenced elements refer to corresponding parts throughout the several views of the drawings.

5. DETAILED DESCRIPTION

The present invention provides systems and materials to improve photovoltaic cell performance by implementing a self-cleaning function on photovoltaic cells and/or on albedo surfaces in the vicinity of photovoltaic cell assemblies. One aspect of the invention provides materials for protecting albedo surfaces that surround photovoltaic cell assemblies, thereby maximizing energy input into the photovoltaic cell assemblies. Another aspect of the invention provides materials for self-cleaning photovoltaic cell panels, thereby maintaining their efficiency. A third aspect of the present invention provides designs for portable albedo collecting devices that are associated with photovoltaic cell assemblies to optimize energy efficiency.

5.1 General Architecture

Figure 2A:
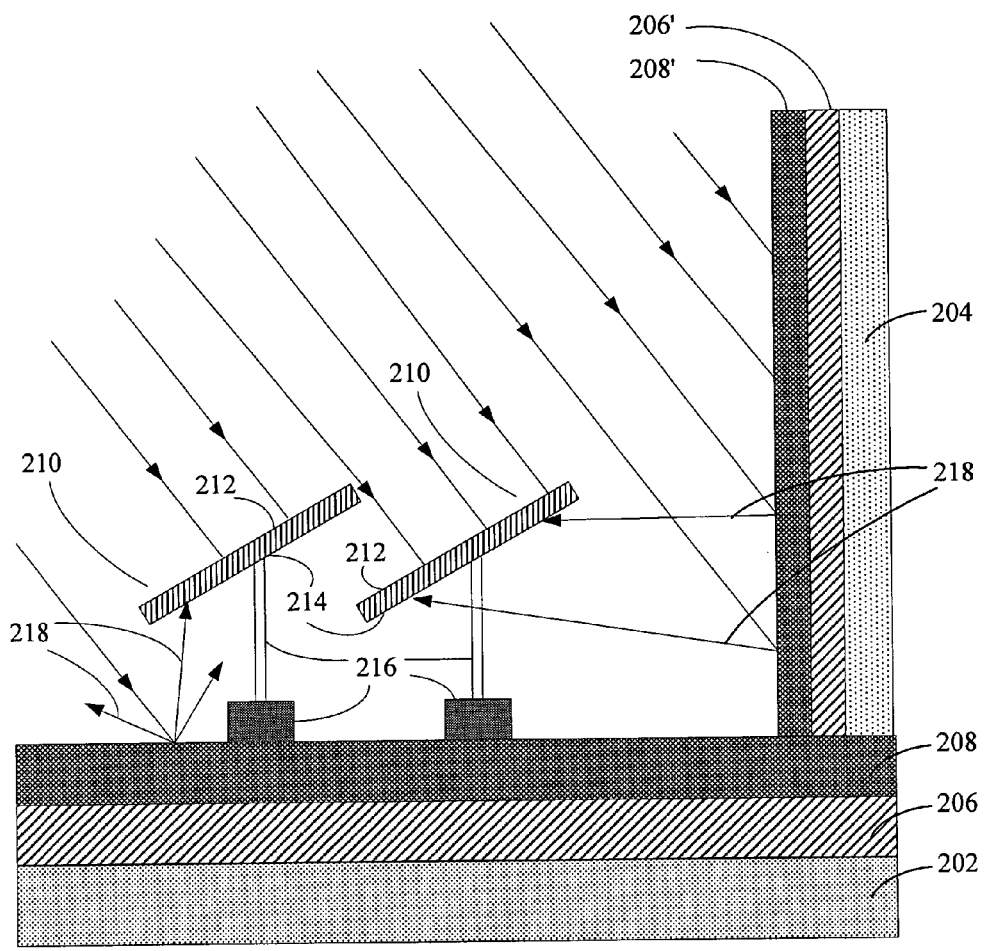
FIG. 2A depicts a perspective view of a photovoltaic cell assembly in accordance with one embodiment of the present invention.

The present invention discloses systems and methods for improving existing photovoltaic cell assemblies that utilize albedo effects thereby improving their performance. As depicted in FIG. 2A, an albedo collector system in accordance with the present invention comprises photovoltaic cell panels 210 and panel support systems 216. In some embodiments, photovoltaic cell panels 210 are bifacial. In such optional embodiments, each photovoltaic panel 210 has a back surface 214 in addition to a front surface 212. However, the present invention is not limited to bifacial photovoltaic cell panels. Photovoltaic cell panels 210 are generally mounted on a surface 202, such as the Earth. Surface 202 is typically not reflective enough to produce a high albedo effect. Therefore, in order to reflect solar light rays 218, surface 202 is covered with a high albedo layer that is comprised of a high albedo layer 206 of material such as white paint, white sand, white gravel, white reflective plastic, or any combination thereof. In some embodiments of the present invention high albedo layer 206 has an albedo of seventy percent or more, eight percent or more, ninety percent or more, ninety-five percent or more, or ninety eight percent or more. The drawback with high albedo layer 206, as described in the background section above, is that it requires cleaning in order to maintain its high albedo properties. Advantageously, in the present invention, high albedo layer 206 is coated with a self-cleaning layer 208 thereby alleviating the need for cleaning high albedo layer 206. In some embodiments, self-cleaning layer 208 is a single layer. In some embodiments, self-cleaning layer 208 is, in fact, a plurality of layers. In embodiments where self-cleaning layer 208 is in fact a plurality of layers, each such layer can made of the same or a different compound. Compounds that can be used to make self-cleaning layer 208 are described below and include photo and non-photocatalytic materials, both hydrophobic and non-hydrophobic.

In some embodiments, the thickness of self-cleaning layer 208 is not greater than 0.2 μm. With such a thickness, coloring of self-cleaning layer 208 due to the interference of light can be avoided. Moreover, self-cleaning layer 208 is more transparent when the layer is made thinner. Thus, in some embodiments, self-cleaning layer 208 is not greater than 0.1 μm.

In some embodiments, an optional reflector wall 204 is used. Like ground 202, optional reflector wall 204 is coated with high albedo layer 206' such as white paint Advantageously, this high albedo layer 206' is coated with a self-cleaning layer 208' so that high albedo layer 206' does not have to be cleaned on a regular basis. The materials that can be used to form self-cleaning layer 208' are the same as those that can be used to form self-cleaning layer 208. Thus, although not explicitly mentioned below, it will be appreciated that any description of a possible composition of self-cleaning layer 208 is also a description of a possible composition for layer 208'.

In some embodiments, self-cleaning layer 208 and/or 208' is one or more layers of a photocatalytic material, such as titanium dioxide or titanium-based nanoparticles, and/or a hydrophobic coating, such as a silicone and/or acrylic resin.

Figure 1:
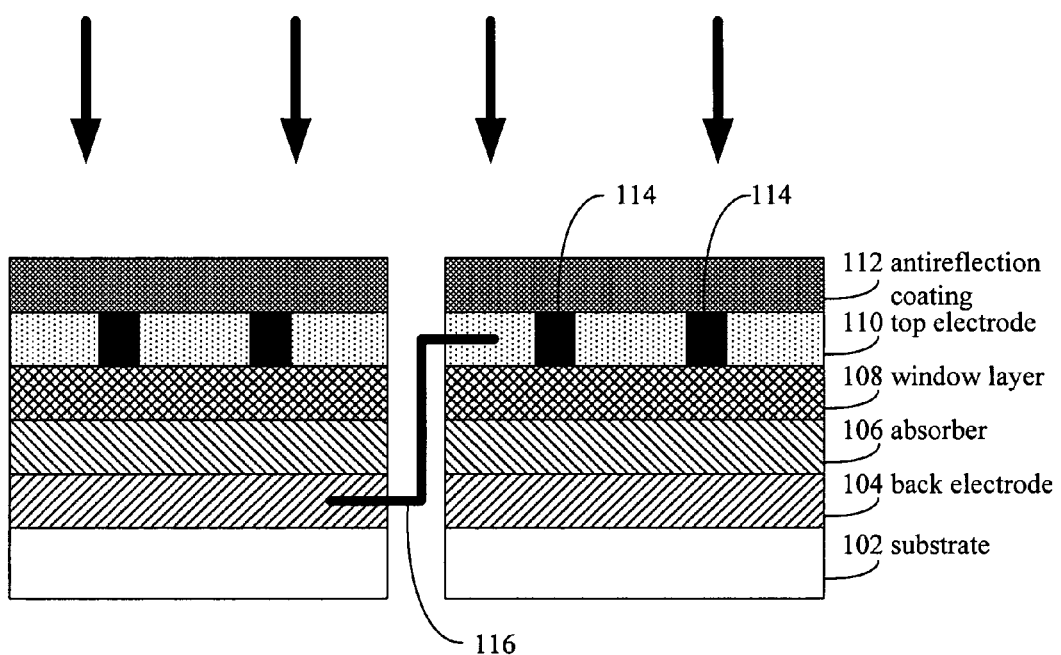
FIG. 1 depicts a photovoltaic cell in accordance with the prior art.
Figure 3:
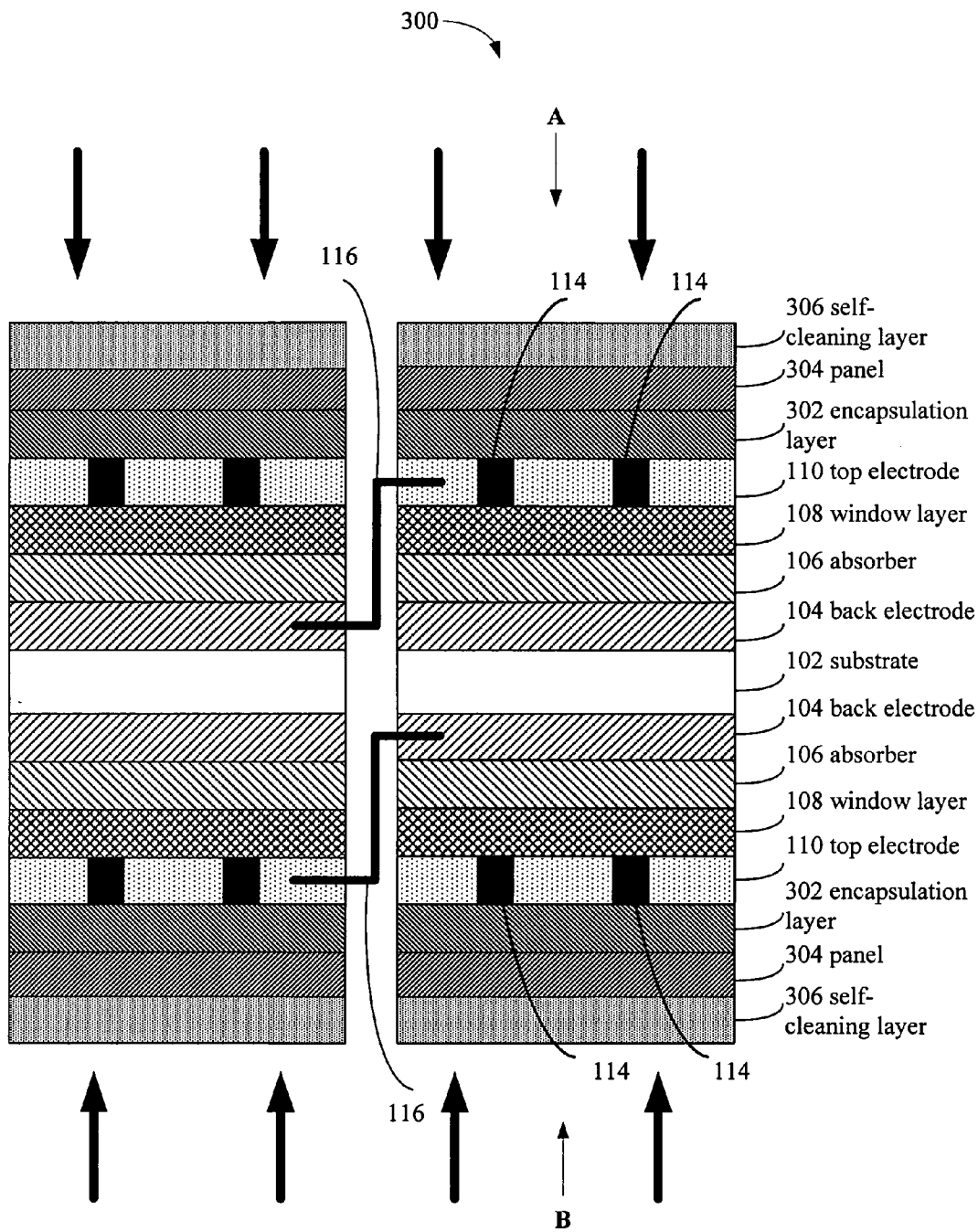
FIG. 3 illustrates a bifacial photovoltaic cell assembly in accordance with an embodiment of the present invention.

As described in the background section, dust or other debris collects on photovoltaic cell panels thereby degrading their efficiency. The present invention addresses this problem by providing a self-cleaning layer to such photovoltaic cell panels. FIG. 3 demonstrates this architecture. FIG. 3 illustrates a bi-facial photovoltaic cell 300. Substrate 102, back-electrode 104, absorber 106, window layer 108, top-electrode 110, and optional bus bar network 114 are as described above in conjunction with Fig. 1. The assembly is encapsulated with a material 302, such as EVA, and encased by panels 304. Panels 304 are typically made of glass or a plastic such as TEDLAR®. Although FIG. 3 is drawn as a bifacial assembly, the invention is not so limited. Photovoltaic cells that include just one absorbing face benefit from the advantages of the present invention as well. Advantageously, photovoltaic cell panel 300 is coated with a self-cleaning layer 306. In some embodiments, self-cleaning layer 306 is one or more layers of a photocatalytic material, such as titanium dioxide or titanium-based nanoparticles, and/or a non-photocatalytic hydrophobic coating, such as a blend of a silicone and/or acrylic resin. In some embodiments, the thickness of self-cleaning layer 306 is not greater than 0.2 µm. With such a thickness, coloring of self-cleaning layer 306 due to the interference of light can be avoided. Moreover, self-cleaning layer 306 is more transparent when the layer is made thinner. Thus, in some embodiments, self-cleaning layer 306 is not greater than 0.1 µm. Although the junctions in solar cells in FIG. 3 are illustrated as a planar, the invention is not so limited. Within panels 304 and encapsulation layer 302, the solar cell junctions can adopt any know solar cell configuration, include planar (as shown), wire based, or rod based. As such, in some embodiments, panels 304 encase a series of parallel wires, where each wire comprises an elongated back electrode core 104, absorber 106, window layer 108, and top electrode 110 layers all circumferentially disposed on the elongated back electrode core 104. In one specific example in accordance with this embodiment, each elongated solar cell in the plurality of elongated solar cells comprises (i) a conductive core configured as a first electrode, (ii) a semiconductor junction circumferentially disposed on the conductive core, and (iii) a transparent conductive oxide layer disposed on the semiconductor junction. Elongated solar cells in the plurality of elongated solar cells are geometrically arranged in a parallel or a near parallel manner thereby forming a planar array having a first face and a second face. The plurality of elongated solar cells is arranged such that one or more elongated solar cells in the plurality of elongated solar cells do not contact adjacent elongated solar cells. The solar cell assembly further comprises a plurality of electrode strips. Each respective electrode strip in the plurality of electrode strips is lengthwise disposed on a first side of a corresponding elongated solar cell in the plurality of elongated solar cells. The first side of the solar cell is part of the first face of the planar array. The solar cell assembly further comprises a transparent electrically insulating substrate (panel 304) that covers all or a portion of the first face of the planar array. A first and second elongated solar cell in the plurality of elongated solar cells are electrically connected in series by an electrical contact that connects the first electrode of the first elongated solar cell to the corresponding electrode strip of the second elongated solar cell. The plurality of elongated solar cells is configured to receive direct light from the first face and the second face of the planar array.

Figure 4:
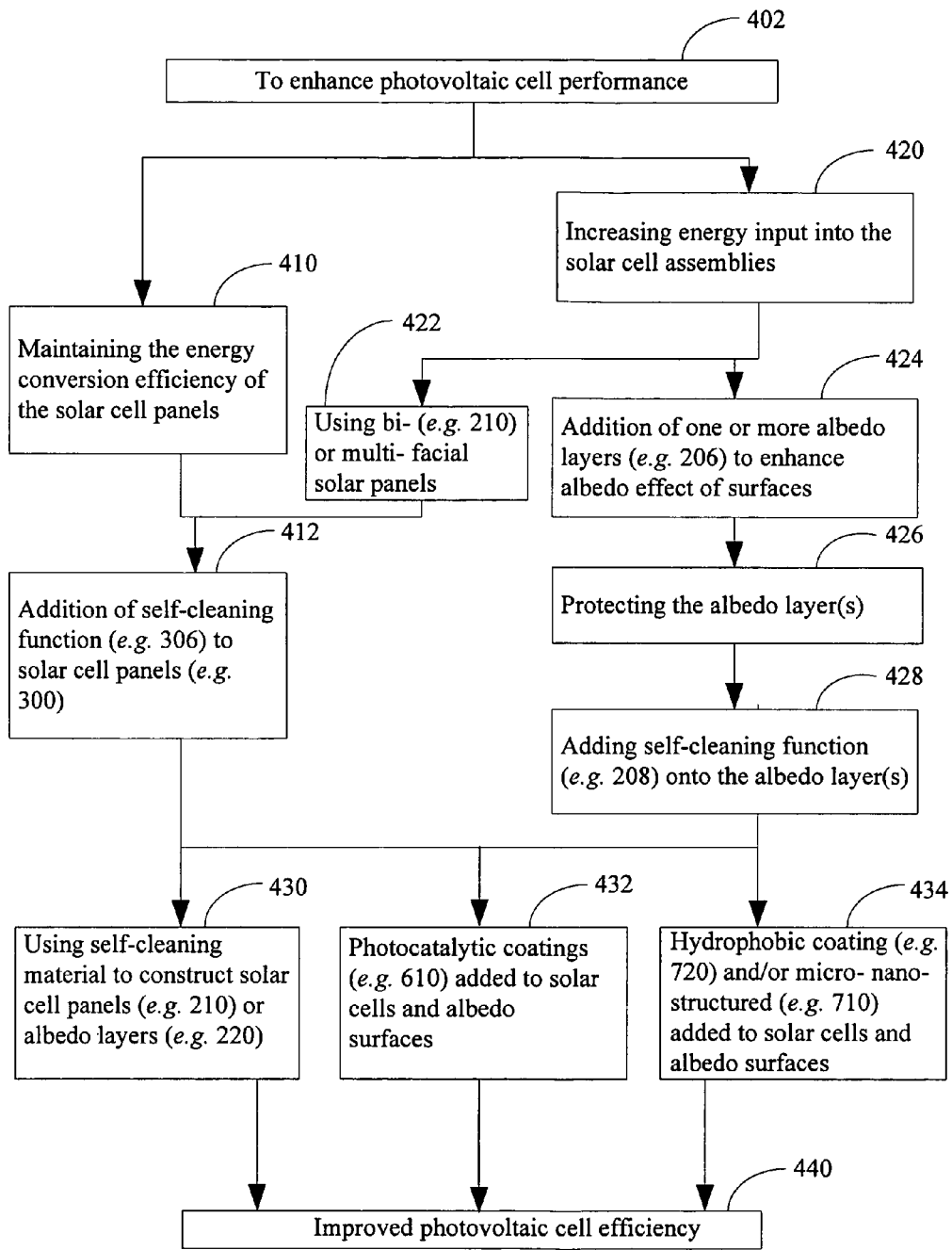
FIG. 4 depicts a process for maintaining albedo surfaces and solar cells in accordance with one aspect of the present invention.

The flowchart depicted in FIG. 4 illustrates two general approaches that improve the efficiency of photovoltaic cell assemblies. The first approach, as depicted by steps 420 through 428, aims to improve the amount of light energy delivered to photovoltaic systems. As such, the first approach operates on self-cleaning layer 208 as depicted in FIG. 2A. This approach includes the addition of one or more albedo layers to enhance the albedo effect of surfaces in the vicinity of solar cell panels (424); protecting such albedo layers (426), and addition of a self-cleaning function to such layers (428). Practice of these steps causes additional solar energy to be absorbed by photovoltaic systems in the form of albedo energy. The second approach, as depicted by steps 104 and 412, aims to maintain the general energy conversion efficiency of existing photovoltaic systems (solar cells). This second approach operates directly on solar cell panels such as those disclosed in FIG. 2A. This second approach involves maintaining the energy conversion efficiency of solar cell panels (410) and the addition of a self-cleaning to such solar cell panels (412). Novel systems and methods, for example, as summarized by steps 430, 432, and 434 of FIG. 4, operate on either albedo surfaces, as illustrated in FIG. 2, and solar cells, as illustrated in FIG. 3, to help improve efficiency. Aspects of steps 430, 432, and 434 include adding a photocatalytic coating 610 to solar cells or albedo surfaces and/or a hydrophobic coating (e.g., micro- or nano-structured) to the same.

5.2 Materials and Methods for Fabricating a Self-cleaning Layer on an Albedo Coating Both photocatalytic and non-photocatalytic materials can be used to realize self-cleaning albedo surfaces. Such materials can be either hydrophobic or hydrophilic. Some specific embodiments of the present invention provide a self-cleaning layer 208 comprising a photocatalytic material. As illustrated in FIG. 2, self-cleaning layer 208 is applied over high albedo layer 206. Some embodiments of the present invention provide a self-cleaning layer 208 that comprises a non-photocatalytic hydrophobic material. Furthermore, in instances where the photocatalytic or non-photocatalytic material is transparent, it can be used in layer 306 (FIG. 3) of solar cell assemblies.

5.2.1 Photocatalytic Materials

Figure 2B:
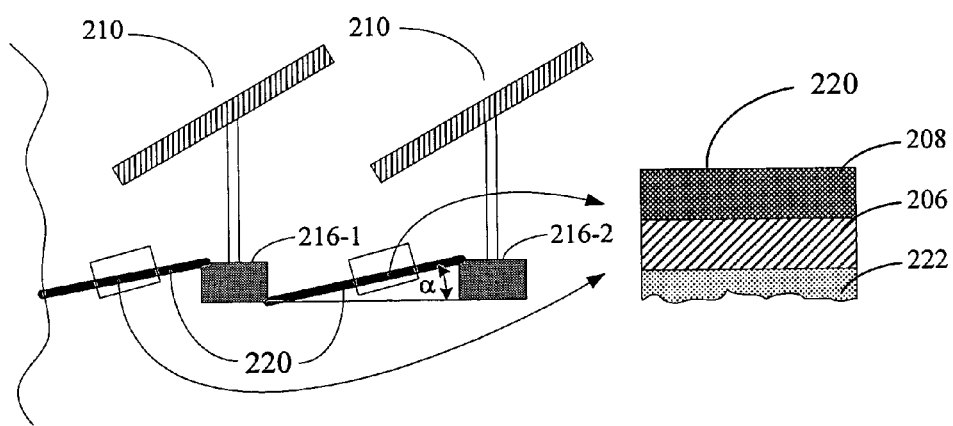
FIG. 2B depicts a cross-sectional view of a photovoltaic cell assembly with portable self-cleaning albedo surfaces in accordance with one embodiment of the present invention.

Photocatalytic material is activated by solar radiation in a process termed photocatalysis. Such activation causes the surface to be hydrophilic. Titanium dioxide or titania (e.g., $TiO_2$) is a known photocatalysts. The preparation of $TiO_2$ is described, for example, in U.S. Pat. No. 6,699,317, which is hereby incorporated herein by reference in its entirety. $TiO_2$ exists in at least three natural mineral forms: anatase, rutile or brookitein $TiO_2$. Among the three natural mineral forms, anatase is the most photoactive. Because of its unique properties, anatase is a highly favored photocatalytic material. In the present invention, $TiO_2$ can be used to form layer 306 (FIG. 3) and/or self-cleaning layer 208 (FIG. 2A and FIG. 2B). In some embodiments of the present invention, $TiO_2$, in the form of anatase, is present in layers 208 and 306.

Figure 6A:
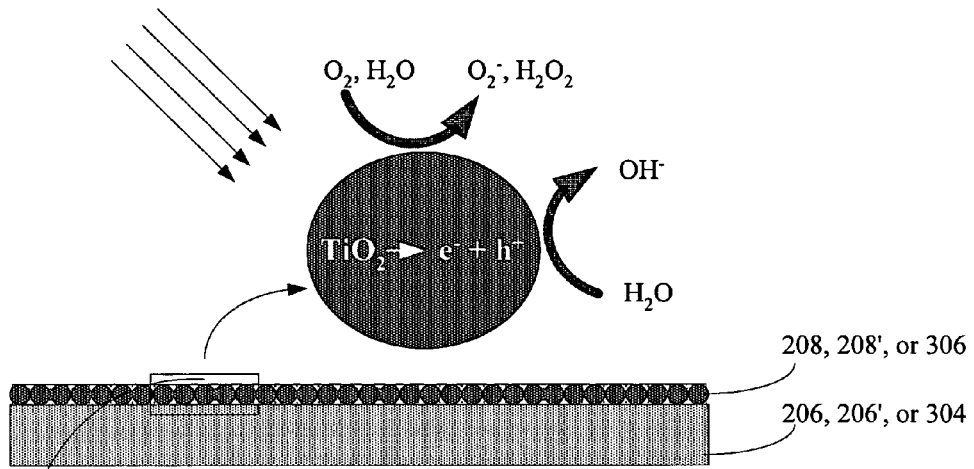
FIG. 6A depicts a self-cleaning mechanism in a photocatalytic protective layer in accordance with an embodiment of the present invention.

Photocatalytic coatings comprise materials that are light radiation sensitive. One such photocatalytic coating is $TiO_2$. Although not intending to be limited to any particular theory, the mechanism for a light-activated self-cleaning layer 208 and/or 306 made of a material such as $TiO_2$ is illustrated in FIG. 6A. The mechanism illustrated in FIG. 6A depicts $TiO_2$ will be appreciated, although it is not so limited. In fact, the mechanism explains a broad range of photocatalytic materials of which $TiO_2$ is just one example. In FIG. 6A, the photocatalytic material, $TiO_2$ for example, is chemically activated by solar light or ultraviolet (UV) radiation. Electrons in $TiO_2$ are excited by UV radiation. The resulting roaming electrons ($e^-$) leave behind holes ($h^+$). Water, dirt, and other forms of debris deposit on the coated surface and either react with the electrons or donate their own electrons to fill the holes. This exchange in electrons generates highly reactive materials such as $H_2O_2$, $OH^-$, and free oxygen radicals. As a result, through a series of UV radiation catalyzed reactions, the impurity or contaminant in the deposited layer is gradually decomposed.

Figure 6B:
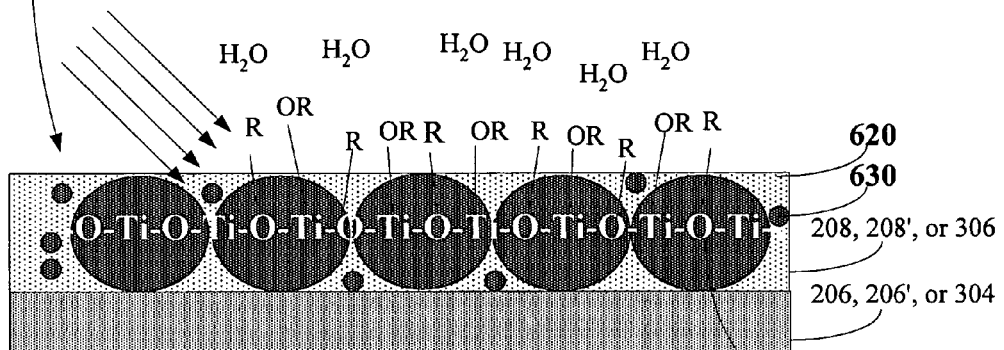
FIG. 6B depicts a hydrophilic mechanism in a photocatalytic self-cleaning protective layer in accordance with an embodiment of the present invention.
Figure 6B:
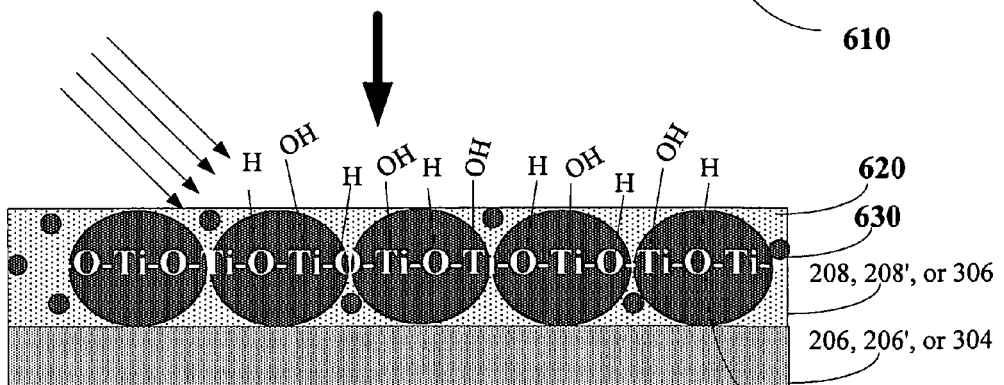

In addition to their photocatalytic properties, materials such as $TiO_2$ make it so that it is more difficult for water to nucleate and form droplets on surfaces containing such materials. Rather, the water slides over the surface as a thin film taking with it any decomposed organic matter. Although not intending to be limited to any particular theory, it is believed that this hydrophilic property arises through the mechanism depicted in FIG. 6B. The mechanism illustrated in FIG. 6B depicts $TiO_2$ will be appreciated, although it is not so limited. In fact, the mechanism explains a broad range of photocatalytic materials of which $TiO_2$ is just one example. Photocatalytic material 610, such as $TiO_2$, is embedded in resin 620, for example, to form self-cleaning layer 208. When exposed to UV radiation, water molecules on the surface of self-cleaning layer 208 are chemisorbed by both photocatalyst 610 and resin 620. As a result, the surface of self-cleaning layer 208 becomes increasingly hydrophilic. Water spreads over the surface in a thin film instead of forming droplets. The decomposed organic and inorganic debris then gets washed away when exposed to water (e.g., rain). Thus, photocatalytic materials render a surface self-cleaning by chemically breaking up dirt and causing it to wash away Some photocatalytic materials in accordance with the present invention are hydrophobic rather than hydrophilic. In some embodiments, the self-cleaning surface has combined hydrophilic and hydrophobic properties. U.S. Pat. No. 6,337,129 to Watanabe et al., which is hereby incorporated herein by reference in its entirety, describes bi-characteristic coating compositions that can be used in layers 306 in accordance with the present invention.

$TiO_2$ has a band gap of 3.2 eV, which allows the oxide to absorb light with wavelengths shorter than 385 nm. Solar radiation, however, contains only a very narrow wavelength range of such high energy rays. Systems and methods have been developed to render $TiO_2$ more photoactive to radiation with longer wavelengths and hence less energy. For example, the photocatalytic property of $TiO_2$ can be altered by adding dopant, such as metallic ions like Ce. Ce retards the phase transition from reactive anatase to inert rutile so that the photocatalytic coating layer remains more sensitive to UV radiation for a longer time. The Ce-doped $TiO_2$ nano particles have better band gap and modified solar absorption. Accordingly, in some embodiments of the present invention, layers 306 and/or self-cleaning 208 comprise doped $TiO_2$.

In some embodiments, layers 306 and/or self-cleaning layer 208 comprise anatase, $TiO_2$, rutile $TiO_2$, brookitein $TiO_2$, anatase sol, peroxo-modified anatase (Kon Corporation, Kishima-gun, Saga-prefecture Japan), and peroxotitanium acid (Kon Corporation). In some embodiments, layers 306 and/or self-cleaning layer 208 comprise ZnO, $SnO_2$, $SrTiO_3$, $WO_3$, $Bi_2O_3$, $Fe_2O_3$, or any combination thereof. Although not intending to be limited to any particular theory, it is believed that, similar to titania, these materials adsorb surface hydroxyl groups ($OH^-$) from oxides, water or oxygen that are exposed to these materials. Thus, incorporation of any combination of these materials into layers 208 and/or 306 provides the advantageous self-cleaning properties similar to the case of $TiO_2$. Further, photocatalysts described in U.S. Pat. No. 6,013,372 and WO 97/23572, each of which is hereby incorporated herein by reference in its entirety, can be used in layers 306 and/or 208.

In some embodiments in accordance with the present invention, inorganic oxides (e.g., 630) are combined with photocatalysts 610 to form self-cleaning layer 208. The inorganic oxides include, but are not limited to silica, alumina, water glass, silicate, aluminosilicate, zirconia, ceria, tin oxide, calcia, magnesia, amorphous titania and other metal oxides. In some embodiments, such materials are hydrophilified by photocatalytic action of the photocatalytic oxide.

The present invention provides no limits on the amount of photocatalytic materials present in layers 208 and 306. For example, the amount of the photocatalytic material in layer 208 and/or 306 can be between 1 percent and 90 percent by weight, between 20 percent and 70 percent by weight, or between 20 percent and 50 percent by weight. The balance of such layers 208 and 306 comprises optional resin 620 (FIG. 6B), optional inorganic oxides 630 (FIG. 6B) and any other filler materials, at all possible combinations of ratios.

There is no requirement that layer 208 and/or 306 be hydrophilic. For example, Ti-hydroxyapatite (TiHAP), obtained, for example, by using titanium to replace calcium in Ca-hydroxyapatite (CaHAP), shares the same photocatalytic properties as $TiO_2$.

TiHAP, however, is different from a composite of $TiO_2$ and hydroxyapatite. It has a low refractive index and high UV adsorption power, but it does not provide the photo-induced hydrophilicity (*Nonami et al., Mater. Res. Bull.*, 33, pp 125, 1998, which is hereby incorporated herein by reference in its entirety). Nevertheless, although it is not hydrophilic, Ti-hydroxyapatite (TiHAP) is a suitable material for use in self-cleaning layer 208 and/or 306 in accordance with embodiments of the present invention.

In some embodiments of the present invention, self-cleaning layer 208 and/or 306 has both hydrophilic and hydrophobic properties. For example, as described in U.S. Pat. No. 6,337,129 to Watanabe et al., which is hereby incorporated herein by reference in its entirety, self-cleaning layer 208 comprises a photocatalytic oxide 610 and resin 620. Resin comprises a silicone resin or silica, and a water-repellent fluororesin. In this embodiment, the silicone or silica and the water-repellent fluororesin are present in a microscopically dispersed and exposed state on the surface of self-cleaning layer 208 and/or 306.

Embodiments of the present invention in which self-cleaning layer 208 comprises a photocatalytic oxide (e.g., 610 of FIG. 6B), supporting resin (e.g., 620 of FIG. 6B), and optional inorganic oxide (e.g., 630 of FIG. 6B) have been described. Exemplary photocatalytic oxides, supporting resins, and optional inorganic oxides of the present invention include, but are not limited to, any chemically stable combination of compounds listed in Table 1 below.

TABLE 1

Exemplary materials for assembling layers 208 and 306

| Component | Exemplary materials |
|---|---|
| 1. Photocatalytic materials (e.g., 610 of FIG. 6B) | |
| photocatalytic oxides | anatase $TiO_2$ |
| | rutile $TiO_2$ |
| | brookitein $TiO_2$ |
| | ZnO |
| | $SnO_2$ |
| | $SrTiO_3$ |
| | $WO_3$ |
| | $Bi_2O_3$ |
| | $Fe_2O_3$ |
| | peroxotitanium acid |
| | peroxo-modified anatase sol |
| Apatite derivatives | Ti-HAP |
| 2. Resins | |

TABLE 1-continued

Exemplary materials for assembling layers 208 and 306

| Component | Exemplary materials |
|---|---|
| (e.g., 620 of FIG. 6B) | |
| silicone resin or silica (for imparting hydrophilic or hydrophobic properties) | methyltrimethoxysilane
methyltriethoxysilane
methyltrichlorosilane
methyltribromosilane
methyltriisopropoxysilane
methyl-tri-t-butoxysilane
ethyltrimethoxysilane
ethyltriethoxysilane
ethyltrichlorosilane
ethyltribromosilane
ethyltriisopropoxysilane
ethyl-tri-t-butoxysilane
n-propyltrimethoxysilane
n-propyltriethoxysilane
n-propyltrichlorosilane
n-propyltribromosilane
n-propyltriisopropoxysilane
n-propyl-tri-t-butoxysilane
n-hexyltrimethoxysilane
n-hexyltriethoxysilane
n-hexytrichlorosilane
n-hexyltribromosilane
n-hexyltriisopropoxysilane
n-hexyl-tri-t-butoxysilane
n-decyltrimethoxysilane
n-decyltriethoxysilane
n-decyltrichlorosilane
n-decyltribromosilane
n-decyltriisopropoxysilane
n-decyl-tri-t-butoxysilane
n-octatrimethoxysilane
n-octatriethoxysilane
n-octatrichlorosilane
n-octatribromosilane
n-octatriisopropoxysilane
n-octa-tri-t-butoxysilane
phenyltrimethoxysilane
phenyltriethoxysilane
phenyltrichlorosilane
phenyltribromosilane
phenyltriisopropoxysilane
phenyl-t-butoxysilane
dimethyldichlorosilane
dimethyldibromosilane
dimethyldimethoxysilane
dimethyldiethoxysilane
diphenyldichlorosilane
diphenyldibromosilane
diphenyldimethoxysilane
diphenyldiethoxysilane
phenylmethyldichlorosilane
phenylmethyldibromosilane
phenylmethyldimethoxysilane
phenylmethyldiethoxysilane
vinyltrichlorosilane
vinyltribromosilane
vinyltrimethoxysilane
vinyltriethoxysilane
vinyltriisopropoxysilane
vinyl-tri-t-butoxysilane
trifluoropropyltrichlorosilane
trifluoropropyltribromosilane
trifluoropropyltrimethoxysilane
trifluoropropyltriethoxysilane
trifluoropropyltriisopropoxysilane
trifluoropropyl-tri-t-butoxysilane
γ-glycidoxypropylmethyldimethoxysilane
γ-glycidoxypropylmethyldiethoxysilane
γ-glycidoxypropyltrimethoxysilane
γ-glycidoxypropyltriethoxysilane
γ-glycidoxypropyltriisopropoxysilane
γ-glycidoxypropyl-tri-t-butoxysilane
γ-methacryloxypropylmethyldimethoxysilane
γ-methacryloxypropylmethyldiethoxysilane |

TABLE 1-continued

Exemplary materials for assembling layers 208 and 306

| Component | Exemplary materials |
|---|---|
| | γ-methacryloxypropyltrimethoxysilane
γ-methacryloxypropyltriethoxysilane
γ-methacryloxypropyltriisopropoxysilane
γ-methacryloxypropyl-tri-t-butoxysilane
γ-aminopropylmethyldimethoxysilane
γ-aminopropylmethyldiethoxysilane
γ-aminopropyltrimethoxysilane
γ-aminopropyltriethoxysilane
γ-aminopropyltriisopropoxysilane
γ-aminopropyl-tri-t-butoxysilane
γ-mercaptopropylmethyldimethoxysilane
γ-mercaptopropylmethyldiethoxysilane
γ-mercaptopropyltrimethoxysilane
γ-mercaptopropyltriethoxysilane
γ-mercaptopropyltriisopropoxysilane
γ-mercaptopropyl-tri-t-butoxysilane
β-(3,4-poxycyclohexyl)ethyltrimethoxysilane
β-(3,4-epoxycyclohexyl)ethyltriethoxysilane |
| water-repellent fluoro-resin | polytetrafluoroethylene
polyvinylidene fluoride
polyvinyl fluoride
polychlorotrifluoroethylene
tetrafluoroethylene/hexafluoropropylene copolymer
ethylene/tetrafluoroethylene copolymer
ethylene/chlorotrifluoroethylene copolymer
tetrafluoroethylene/perfluoroalkyl vinyl ether copolymer
perfluorocyclo polymer
vinyl ether/fluoroolefin copolymer
vinyl ester/fluoroolefin copolymer
tetrafluoroethylene/vinyl ether copolymer
chlorotrifluoroethylene/vinyl ether copolymer
urethane-crosslinked tetrafluoroethylene
epoxy-crosslinked tetrafluoroethylene
acryl-crosslinked tetrafluoroethylene
melamine-crosslinked tetrafluoroethylene |
| 3. Inorganic oxide (e.g., material 630 of FIG. 6B) | silica
alumina
water glass
silicate
aluminosilicate
zirconia
ceria
tin oxide
calcia
magnesia
amorphous titania |

Various techniques and methods are available for coating photocatalytic materials of the present invention onto high albedo layer 206 (FIG. 2A) and layer 304 (FIG. 3) in order to form self-cleaning layers 208 and/or 306. Such techniques include, but are not limited to, screen or roller printing, electrostatic glazing, and spraying. In addition, techniques described in Madou, 2002, *Fundamentals of Microfabrication*, Second Edition, CRC Press, Boca Raton, which is hereby incorporated herein by reference in its entirety, can be used to form self-cleaning layer 208 and/or 306.

In some embodiments, a transparent coating is used for layer 306 and/or self-cleaning layer 208. In some embodiments, the photocatalytic coating materials are available as water-based solutions (e.g., Titernal W, Fushimi Co. Mizoguchi, Sanda City, Hyogo Japan) or ethanol-based solutions (e.g., Titernal E, Fushimi Co.). In some embodiments, such solutions are sprayed onto high albedo layer 206 and panel 304 in order to form self-cleaning layers 208 and/or 306.

In some embodiments, self-cleaning layer 208 and/or layer 306 is formed using a reverse micelle dip coating method in which a transparent nano-crystalline $TiO_2$ thin film is deposited. In the reverse micelle method a surfactant (e.g., Triton X-100), a co-surfactant (e.g., hexanol), a continuous phase (e.g., cyclohexane), and titanium isopropoxide are mixed together. The solution is applied to the proper surface (e.g., surface 304), for example, by dip coating. After drying and calcination in air, a multifunctional thin film of nano-crystalline $TiO_2$ is formed. In some embodiments, application of the micelle solution in order to form self-cleaning layer 208 and/or layer 306 comprises removing excess solution, padding the surface, and heating the surface (e.g., to over 90° C.). See, for example, Daoud et al., 2004, *J. Am. Ceram. Soc.* 87, p. 953-555, which is hereby incorporated herein by reference in its entirety.

In some embodiments of the invention, self-cleaning layer 208 and/or layer 306 is formed from a peroxotitanium acid solution. The solution comprises peroxotitanium acid anywhere from 0.3% by weight up to the maximum allowed by the solubility of peroxotitanium acid in solution. Examples of such a solution include, but are not limited to, PTA-85 and PTA-170 (Green Millennium, Los Angeles, Calif.), which comprises peroxotitanium acid at 0.85% and 1.7% by weight, respectively.

In some embodiments of the invention, self-cleaning layer 208 and/or layer 306 is a self-cleaning photocatalytic coating material formed from peroxo-modified anatase sol. The solution comprises from peroxo-modified anatase sol anywhere from 0.3% by weight up to the maximum allowed by the solubility of peroxo-modified anatase sol in solution. Examples of such a solution include, but are not limited to, peroxo-modified anatase sol (Green Millennium, Los Angeles, Calif.) at 0.85% and 2.2% by weight, respectively.

In some embodiments of the invention, self-cleaning layer 208 and/or layer 306 is a self-cleaning photocatalytic coating material formed from a mixture of peroxo-modified anatase sol and peroxotitanium acid. The solution comprises peroxo-modified anatase sol and peroxotitanium acid anywhere from 0.3% by weight up to the maximum allowed by the solubility of these compounds in solution. The mixture of peroxo-modified anatase sol and peroxotitanium acid comprises two components at any ratio. Examples of such a mixture include, but are not limited to TPX-85 and TPX-220 (Green Millennium, Los Angeles, Calif.) which comprises peroxo-modified anatase sol and peroxotitanium acid at 0.85% and 2.2% by weight, respectively.

In some embodiments, a hybrid system is used to apply self-cleaning layer 208 and/or layer 306 when such a layer is made from anatase $TiO_2$. The hybrid system utilizes an inert sol-gel coating and a layer of anatase $TiO_2$ on top. For example, referring to FIG. 6B, a sol-gel layer 620 acts to adhere nano-sized $TiO_2$ particles 610. Layer 620 also acts as a barrier to protect high albedo layer 206 from photocatalytic reactions.

In some embodiments, a suitable transparent coating of $TiO_2$ is applied by methods such as painting (e.g., spraying, roller painting, etc., followed by optional heat treatment) to form self-cleaning layer 208 and/or 306. In some embodiments, layer 306 and/or self-cleaning layer 208 comprises TiHAP, and is applied as a spray paint. In some embodiments, layer 306 and 304 is purchased as an assembled composite comprising a glass pane (layer 304) that has already been coated with a photocatalytic layer 306. Examples of such assembled composites include, but are not limited to, ACTIV™ glass from Pilkington Holdings Inc. (Toledo, Ohio).

In some embodiments, in order to make layer 208 and/or layer 306, a coating of an amorphous form of titania is deposited and then calcined to thereby transform by phase transition the amorphous titania into crystalline titania (e.g., anatase, rutile or, brookitein). Such a method can be used, for example, where high albedo layer 206 is highly heat resistant (e.g., white gravel, white sand, white cement, etc.). Formation of amorphous titania can be carried out by one of the following methods.

(1) Hydrolysis and Dehydration Polymerization of Organic Titanium Compound. To an alkoxide of titanium, such as tetraethoxytitanium, tetraisopropoxytitanium, tetra-n-propoxytitanium, tetrabuthoxytitanium, or tetramethoxytitanium, is added a hydrolysis inhibitor such as hydrochloric acid and ethylamine, the mixture being diluted by alcohol such as ethanol or propanol. While subjected to partial or complete hydrolysis, the mixture is applied to the surface of the substrate by spray coating, flow coating, spin coating, dip coating, roll coating or any other suitable coating method, followed by drying at a temperature ranging from the ambient temperature to 200° C. Upon drying, hydrolysis of titanium alkoxide will be completed to result in the formation of titanium hydroxide which then undergoes dehydration polymerization whereby a layer of amorphous titania is formed on the surface of the substrate (e.g., on layer 206). In lieu of titanium alkoxide, other organic compounds of titanium such as chelate of titanium or acetate of titanium may be employed.

(2) Formation of Amorphous Titania from Inorganic Titanium Compound. An acidic aqueous solution of an inorganic compound of titanium such as $TiCl_4$ or $Ti(SO_4)_2$ is applied to the surface of a substrate by spray coating, flow coating, spin coating, dip coating, or roll coating. The substrate is then dried at a temperature of 100-200° C. to subject the inorganic compound of titanium to hydrolysis and dehydration polymerization to form a layer of amorphous titania on the surface of the substrate. Alternatively, amorphous titania may be formed on the surface of the substrate by chemical vapor deposition of $TiCl_4$.

(3) Formation of Amorphous Titania by Sputtering. Amorphous titania can be deposited on the surface of the substrate (e.g., onto layer 206) by bombarding a target of metallic titanium with an electron beam in an oxidizing atmosphere.

(4) Calcination Temperature. Calcination of amorphous titania can be carried out at a temperature at least higher than the crystallization temperature of anatase. Upon calcination at a temperature of 400-500° C. or more, amorphous titania can be transformed into the anatase form of titania. Upon calcination at a temperature of 600-700° C. or more, amorphous titania can be transformed into the rutile form of titania.

In some embodiments, layer 208 and/or 306 comprises a mixture of titania and silica. In such embodiments, the ratio of silica to the sum of titania and silica (by mole percent) can be 5-90%, preferably 10-70%, more preferably 10-50%. The formation of a layer 208 and/or 306 comprised of silica-blended titania can be carried out by any of the following methods.

(1) A suspension containing particles of the anatase form or rutile form of titania and particles of silica is applied to panel 304 and/or high albedo layer 206, followed by sintering at a temperature less than the softening point of panel 304 and or high albedo layer 206.

(2) A mixture of a precursor of amorphous silica (e.g., tetraalkoxysilane such as tetraethoxysilane, tetraisopropoxysilane, tetra-n-propoxysilane, tetrabuthoxysilane, and tetramethoxysilane; silanol formed by hydrolysis of tetraalkoxysilane; or polysiloxane having a mean molecular weight of less than 3000) and a crystalline titania sol is applied to panel 304 and/or high albedo layer 206 and is subjected to hydrolysis where desired to form silanol, followed by heating at a temperature higher than about 100° C.

to subject the silanol to dehydration polymerization to thereby form a photocatalytic coating wherein titania particles are bound by amorphous silica. In this regard, if dehydration polymerization of silanol is carried out at a temperature higher than about 200° C., polymerization of silanol is accomplished to a high degree so that the alkali resistance of the photocatalytic coating is enhanced.

(3) A suspension comprised of particles of silica dispersed in a solution of a precursor of amorphous titania (e.g., an organic compound of titanium such as alkoxide, chelate or acetate of titanium; or an inorganic compound of titanium such as $TiCl_4$ and $Ti(SO_4)_2$) is applied to panel 304 and/or high albedo layer 206 and then the precursor is subjected to hydrolysis and dehydration polymerization at a temperature ranging from the ambient temperature to 200° C. to thereby form a thin film of amorphous titania such that particles of silica are dispersed. Then, the thin film is heated at a temperature higher than the crystallization temperature of titania but lower than the softening point of the substrate to thereby transform amorphous titania into crystalline titania by phase transition.

(4) Added to a solution of a precursor of amorphous titania (e.g., an organic compound of titanium such as an alkoxide, chelate or acetate of titanium; or an inorganic compound of titanium such as $TiCl_4$ or $Ti(SO_4)_2$) is a precursor of amorphous silica (e.g., a tetraalkoxysilane such as tetraethoxysilane, tetraisopropoxysilane, tetra-n-propoxy-silane, tetrabuthoxysilane, or tetramethoxysilane; a hydrolyzate thereof, e.g., silanol; or a polysiloxane having a mean molecular weight of less than 3000) and the mixture is applied to panel 304 and/or high albedo layer 206. Then, these precursors are subjected to hydrolysis and dehydration polymerization to form a thin film made of a mixture of amorphous titania and amorphous silica. Thereafter, the thin film is heated at a temperature higher than the crystallization temperature of titania but lower than the softening point of panel 304 and/or high albedo layer 206 to thereby transform amorphous titania into crystalline titania by phase transition.

In some embodiments, layer 208 and/or layer 306 comprises a mixture of titania and tin oxide. The ratio of tin oxide to the sum of titania and tin oxide can be 1-95% by weight, preferably 1-50% by weight. Formation of a layer 208 and/or layer 306 comprised of tin oxide-blended titania can be carried out by any of the following methods.

(1) A suspension containing particles of the anatase form or rutile form of titania and particles of tin oxide is applied to panel 304 and/or high albedo layer 206, followed by sintering at a temperature less than the softening point of panel 304 and/or high albedo layer 206.

(2) A suspension comprised of particles of tin oxide dispersed in a solution of a precursor of amorphous titania (e.g., an organic compound of titanium such as alkoxide, chelate or acetate of titanium; or an inorganic compound of titanium such as $TiCl_4$ or $Ti(So_4)_2$) is applied to panel 304 and/or high albedo layer 206 and then the precursor is subjected to hydrolysis and dehydration polymerization at a temperature ranging from the ambient temperature to 200° C. to thereby form a thin film of amorphous titania such that particles of tin oxide are dispersed within the film. Then, the thin film is heated at a temperature higher than the crystallization temperature of titania but lower than the softening point of panel 304 and/or high albedo layer 206 to thereby transform amorphous titania into crystalline titania by phase transition.

In some embodiments, layer 208 and/or layer 306 is a coating composition wherein particles of a photocatalyst are dispersed in a film forming element of uncured or partially cured silicone (organopolysiloxane) or a precursor thereof. In some embodiments, the coating composition is applied on panel 304 and/or high albedo layer 206 and the film-forming element is then subjected to curing. Upon photoexcitation of the photocatalyst, the organic groups bonded to the silicon atoms of the silicone molecules are substituted with hydroxyl groups under the photocatalytic action of the photocatalyst. This method provides several advantages. Since the photocatalyst-containing silicone paint can be cured at ambient temperature or at a relatively low temperature, this method can be applied to a substrate formed of a non-heat-resistant material such as plastics. The coating composition containing the photocatalyst can be applied whenever desired by way of brush painting, spray coating, roll coating and the like on any existing substrate requiring superhydrophilification of the surface.

In some embodiments, layer 208 and/or 306 is doped with a metal such as Ag, Cu and Zn. Doping of the layer with a metal such as Ag, Cu or Zn can be carried out by adding a soluble salt of such metal to a suspension containing particles of the photocatalyst, the resultant solution being used to form layer 208 and/or 306. Alternatively, after forming layer 208 and/or 306, a soluble salt of such metal can be applied thereon and can be subjected to irradiation of light to deposit the metal by photoreduction. While not intending to be limited to any particular theory, is believed that layer 208 and/or 306 doped with a metal such as Ag, Cu or Zn is capable of killing bacteria adhered to the surface. Moreover, it is believed that doped layers 208 and/or 306 inhibit growth of microorganisms such as mold, algae and moss. As a result, albedo surface 206 and/or panel 304 are clean for a longer period. In some embodiments, layer 208 and/or 306 can additionally be doped with a metal of the platinum group such as Pt, Pd, Rh, Ru or Ir. These metals can be similarly doped into the composition used to make layer 208 and/or 306 by photoreduction deposition or by addition of a soluble salt. While not intending to be limited to any particular theory, it is believed that a layer 208 and/or 306 doped with a metal of the platinum group develops an enhanced photocatalytic redox activity so that decomposition of contaminants adhering on the surface is promoted.

In some embodiments, layer 208 and 206 is a single combined layer comprising white paint that is doped with any of the photoactive materials described in this section. Properties of suitable white paints are described in the section below. In one particular embodiment, combined layer 208/206 is one or more layers of white paint that has been doped with $TiO_2$, anatase $TiO_2$, rutile $TiO_2$, brookitein $TiO_2$, ZnO, $SnO_2$, $SrTiO_3$, $WO_3$, $Bi_2O_3$, or $Fe_2O_3$, or any combination of such dopants. In some embodiments, care is taken to ensure that such dopants are in the uppermost part of combined layer 208/206 by adding the dopant particles (e.g., $TiO_2$) while the paint is still wet.

In some embodiments, layer 208 and/or 306 is administered using a hot aerosol layering operation. Such processes have been developed by companies such as Nextrom (Duluth, Georgia and Camarillo, Calif.). The hot aerosol process is based on the combustion of liquid raw materials in an atmospheric flame. As the precursor liquid is atomized, the droplets containing the raw materials and solvent evaporate, and finally condense again to become homogeneous, nano-sized particles, that are deposited on layer 206 and/or 304.

5.2.2 Non-photocatalytic Materials

In some embodiments of the present invention, self-cleaning layers 208 and 306 are self-cleaned through mechanisms other than a primary photocatalytic mechanism. In other words, in some embodiments, self-cleaning layers 208 and/or 306 have a self-cleaning property through some mechanism independent of a photocatalytic property. This does not necessarily mean that such layers do not include photocatalytic materials and that some self-cleaning functionality is present in such materials. In fact, it is possible that some of the compositions of matter described in this section are photocatalytic. However, in each instance, the compositions in this section provide a self-cleaning functionality by way of a mechanism that is additional to or lieu of a photocatalytic mechanism.

Figure 7A:
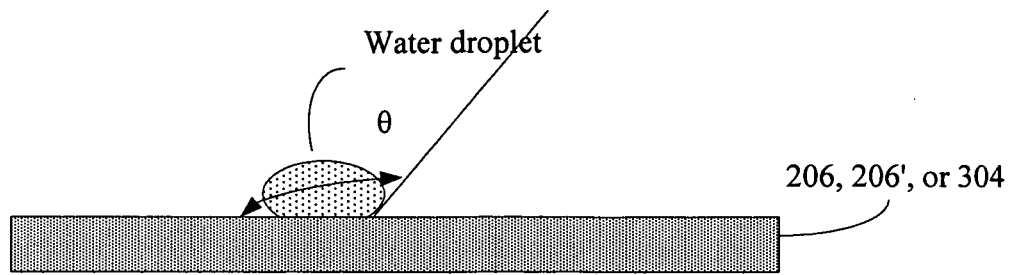
FIG. 7 depicts a self-cleaning mechanism of a non-photocatalytic hydrophobic protective layer in accordance with an embodiment of the present invention.

In some embodiments, self-cleaning layer 208 and/or layer 306 is a hydrophobic material. Without intending to be limited by any particular theory, when a drop of water touches a solid surface, both the solid surface and the drop are surrounded by air at the same time (FIG. 7A). Thus, there are three phases in contact with each other: a solid, a liquid, and a gas. The interactions at this "three-phase boundary" determine the shape of the drop and how well or poorly the liquid spreads over the solid surface, in other words, how well it wets the solid substrate. One way of measuring this is the contact angle $\theta$ (FIG. 7A). When a drop of water contacts a cleaned glass surface, the contact angle $\theta$ is around 15 degrees whereas by comparison, the same drop of water is on a Teflon coated surface forms a contact angle of 109°. This demonstrates that Teflon has desirable hydrophobic properties. However, Teflon absorbs light in the upper visible and UV ranges (Seres et al., 1994, Opt. Eng. 33, p. 3031-3033, which is hereby incorporated herein by reference in its entirety) and in the infrared region between 6 μm to 8 μm (Hollahan et al., 1974, *Applied Opt.* 13, p. 1844-1849, which is hereby incorporated herein by reference in its entirety). Such absorption compromises the efficiency of solar energy conversion. Therefore, the use of TEFLON® coating for use as self-cleaning layers 208 and/or 306 may be limited.

An alternative to TEFLON® material is a water repellant coating constructed from a composite material of $CaF_2$ and $TiO_2$, as described by Tsai et al., in U.S. Pat. No. 6,383,629, which is hereby incorporated herein by reference in its entirety. Though the composite material of $CaF_2$ and $TiO_2$ does not have a contact angle $\theta$ that is significantly better than that of Teflon, it does not have the optical limitations of Teflon material. In some embodiments, self-cleaning layer 208 and/or layer 306 is made of polytetrafluoroethylene (PTFE) [—$CF_2$—$CF_2$—]$_n$ or polychlorotrifluoroethylene (PCTFE) [—$CF_2$—$CFCl$—]$_n$. In some embodiments, self-cleaning layer 208 comprises a Teflon TEFLON® coating. See, for example, U.S. Pat. No. 4,869,922 to D'Agositno, U.S. Pat. No. 4,410,563 to Richter and Dibble, as well as Hollahan et al., *Applied Opt.* 13, p. 1844-1849, 1974, each of which is hereby incorporated herein by reference in its entirety. In some embodiments, self-cleaning layer 208 comprises $CaF_2$ and $TiO_2$. In some embodiments, self-cleaning layer 208 comprises a material having a chemical formula (100-X)$CaF_2$ —(X)$TiO_2$, where X is the molar percentage of $TiO_2$. For more information on such compounds, see U.S. Pat. No. 6,383,629 to Tsai et al., which is hereby incorporated herein by reference in its entirety. In some embodiments, X is between 1 percent and 50 percent. In some embodiments, X is between 2 percent and 45 percent. In some embodiments, X is between 10 percent and 30 percent.

In some embodiments in accordance with the present invention, the Lotus-Effect is used to provide desired self-cleaning properties like that found in plant leaves such as the Sacred Water Lilly (*Nelumbo nucifera*). The Lotus-Effect is based on the interaction between a solid surface (lotus leaf) and its environment (water droplets), and is therefore a surface phenomenon. Electron microscopy study of the lotus leaves revealed that they have "rough" surfaces of small humps and some fronds (e.g., 710 in FIG. 7C). In addition, the surfaces of the lotus leaves are coated by hydrophobic wax-like material (e.g. 720 in FIG. 7C). The combination of these two factors results in a hydrophobic nano- or micro-structured surface (e.g., self-cleaning 208 or layer 306 in FIG. 7B and FIG. 7C). The relationship of micro- or nano- structured "rough" surfaces and hydrophobicity, and the applicability of the "Lotus Effect" on surfaces, is described in U.S. Pat. No. 6,800,354 to Baumann, et al. and by U.S. Pat. No. 6,852,389 to Nun, et al., each of which is hereby incorporated herein by reference in its entirety.

Figure 7B:
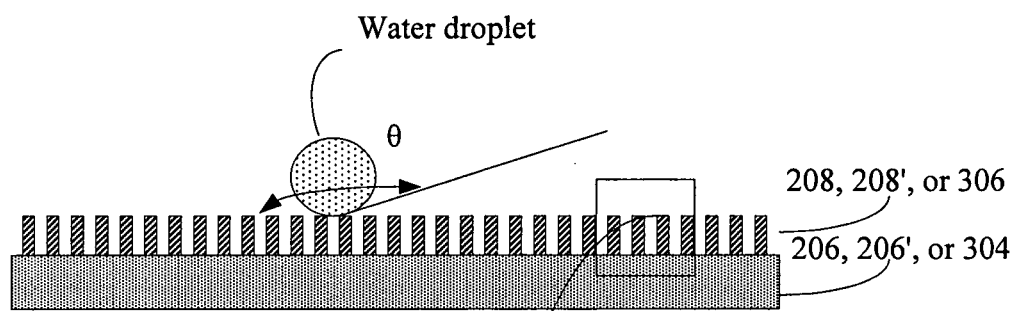
Figure 7C:
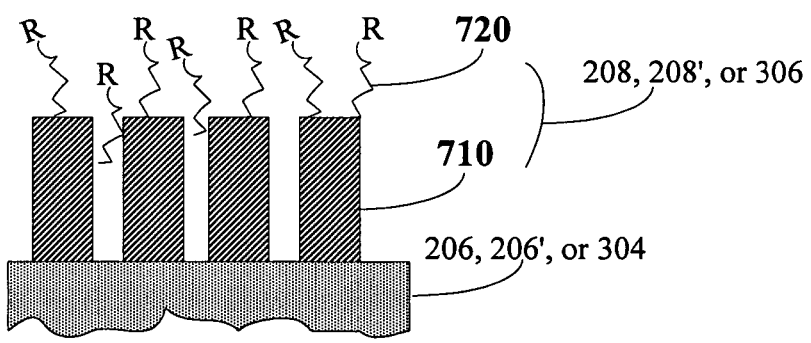

In some embodiments, of the present invention, self-cleaning layer 208 and/or layer 306 is a rough surface comprising hydrophobic nano- or micro-structured surfaces as illustrated in FIG. 7B. In some embodiments, such structured surfaces cause water to have a contact angle $\theta$ that exceeds 160 degree. The size of the surface structures (e.g., 710 in FIG. 7C) ranges from several nanometers up to 50 microns. When combined with hydrophobic coatings (e.g., 720 in FIG. 7C), such "rough" surfaces are effectively hydrophobic. Spherical water droplets roll off such surfaces (e.g., self-cleaning layer 208 or layer 306 in FIG. 7B and 7C). Therefore, they remain dry even when it is raining. In some embodiments the materials used to make surface structures 710 and hydrophobic coatings 720 are transparent. Such materials can therefore be used to form layer 306 on solar cells in addition to forming a self-cleaning layer 208 on high albedo layer 206. Particles 710 can be obtained in commercially available sizes and or by a precipitation processes such as, for example, by a pyrogenic process. Alternatively, particles 710 can be obtained be obtained from a gaseous starting material that is converted into a pulverulent substance.

Particles 710 can be any combination of the materials listed in Table 2 below. In some embodiments, particles 710 comprise oxides such as $SiO_2$, $TiO_2$, $Al_2O_3$, $ZrO_2$ or $SnO_2$. These oxides are typically pyrogenically prepared oxides. In some embodiments particles 710 are pyrogenic silica with an average primary particle size in the range between about 7 nm and 40 nm. In some embodiments, particles 710 comprise a silicate, a doped silicate, a mineral, a metal oxide, a silica, a polymer, and/or a coated metal powder. In some embodiments, particles 710 comprise fumed silica, precipitated silica, or a pulverulent polymer, e.g., a cryogenically milled or spray-dried polytetrafluoroethylene (PTFE).

In some embodiments, self-cleaning layer 208 is LOTUSAN™ paint (Sto, Germany). The paint can be applied with brush, roller, or proper spray equipment. The LOTUSAN™ paint comprises 1-5% triethoxy (2, 4, 4-trimethylpentyl) silane, 15-40% Cristobalite ($SiO_2$), and 10-30% $TiO_2$, by weight. In some embodiments, the self-cleaning layer is a hydrophilic paint that comprises an acrylic resin, an acryl-silicone resin, an aqueous silicone, a block copolymer of silicone resin and acrylic resin, an acryl-styrene resin, an ethylene oxide of sorbitan fatty acid, an ester of sorbitan fatty acid, an acetate of urethane, a cross-linked urethane of polycarbonatediol and/or polyisocyanate, or a cross-linked polymer of alkylester polyacrylate. In some embodiments, self-cleaning layer 208 is a water-repellant paint containing polytetrafluoroethylene (PFTE). In embodiments where layer 208 is a paint, high-albedo layer 206 is optional, particularly in instances where the paint used for layer 208 is a white paint or otherwise has an albedo greater than ninety percent.

It is to be noted that although $TiO_2$ and other photocatalytic oxides are found in Various hydrophobic coating materials listed herein, it is not because of their possible Photocatalystic properties. Rather, such oxides provide roughness and control the Formation of micro- or nano- structured surfaces.

TABLE 2

Exemplary materials for use in layers 208 and 306 in which photoactivity is not the primary basis for self-cleaning

| Component | Exemplary materials |
|---|---|
| 1. Teflon Coating | polytetrafluoroethylene (PTFE) polychlorotrifluoroethylene (PCTFE) |
| 2. Composite inorganic coating | $CaF_2$ and $TiO_2$ |
| 3. Coating based on Lotus Effect | |
| 3a. Structural forming material | |
| inorganic substances | metal oxides |
| | mixed oxides |
| | silicates |
| | sulfates |
| | phosphates |
| | borates |
| | metal sulfides |
| | oxosulfides |
| | selenides |
| | sulfoselenides |
| | metal nitrides |
| | oxide nitrides |
| Organic substances | nanoscale organic polymeric particles |
| | nanoscale organic polymeric particles containing fluorine. |
| 3b. Hydrophobic coating | particles comprising PTFE or any other suitable hydrophobic materials |

5.2.3 Self-cleaning Albedo Layers

In some embodiments, high albedo layer 206 and self-cleaning layer 208 form a single self-cleaning high albedo layer. The self-cleaning property in such a layer can be rendered by either a photocatalytic or hydrophobic mechanism. One embodiment in accordance with this aspect of the invention is the application of white LOTUSAN™ paint as a single combined layer 206/208.

5.3 High Albedo Devices

Another aspect of the present invention provides a self-cleaning albedo device 220 gas illustrated, for example, in FIG. 2B. In some embodiments, device 220 is attached to the base of photovoltaic cell supporting system 216. In some embodiments, device 220 comprises a substrate 222 with a high albedo layer 206 disposed thereon. Typically, substrate 222 is made of a highly flexible material that can be rolled or folded up. In some embodiments, a high albedo layer 206, for example, a layer of white paint or any of the materials described for layer 206 in preceding sections, is disposed on substrate 222.

In some embodiments, flexible substrate 222 is itself a high albedo material. High albedo layer 206 is not necessary embodiments of device 220 where the substrate 222 has high albedo (e.g. albedo greater than ninety percent). As illustrated in FIG. 2B, self-cleaning layer 208 is disposed on high albedo layer 206 (or directly onto flexible substrate 222 in instances where flexible substrate 222 possesses albedo properties and thus high albedo layer 206 is not present).

In some embodiments device 220 comprises a single layer of MYLAR® or any of a number of other low-cost plastics that can be manufactured with high albedo. In such embodiments, flexible substrate 222 is optional and often is not included. Furthermore, because of the low cost the MYLAR® (or other type of low-cost plastic), in some embodiments self-cleaning layer 208 is not present as well.

In some embodiments, there is a sloped gradient between respective solar cell assemblies in the manner illustrated in FIG. 2B. Each solar cell assembly includes a respective device 220 as illustrated in FIG. 2B. In some embodiments, device 220 is rolled down the gradient. Thus, any water that lands on device 220 rolls down the gradient rather than collecting on the surface and forming water spots. In some embodiments, device 220 is a folded assembly instead of the roll-up type. Regardless of whether assembly 220 is of the roll-up type or the fold-up type, the assembly 220 will preferably attach to hooks on the bottom of each photovoltaic cell supporting system 216 in order to allow the device 220 to be removed to make room for maintenance.

In some embodiments in accordance with the present invention, device 220 is a plastic sheet that can be easily rolled or folded away, stored and assembled with any existing photovoltaic cell system. See Section 5.5 for more description of photovoltaic cell systems that can be used in the present invention. In some embodiments in accordance with the present invention, device 220 is a self-cleaning albedo plastic sheet that can be rolled or folded out and attached to the base 216 of the photovoltaic cell support 216 by a hinge mechanism.

In some embodiments in accordance with the present invention, substrate 222 is a board that can be easily stored and assembled in any existing photovoltaic cell systems. High albedo layer 206, for example a layer of white paint, is disposed upon substrate 222. A self-cleaning layer 208 is then disposed upon high albedo layer 206.

Some embodiments of the present invention provide a photovoltaic cell system comprising a plurality of photovoltaic cell assemblies. Each assembly in the plurality of photovoltaic cell assemblies comprises a base, a solar cell panel attached to the base, and a self-cleaning albedo device (e.g., device 220 of FIG. 2B), attached to the base. The self-cleaning albedo device comprises a flexible substrate (e.g., 222 of FIG. 2B), a high albedo layer (e.g., layer 206 of FIG. 2B), and a self-cleaning layer (e.g., layer 208 of FIG. 2B). The high albedo layer is disposed on the flexible substrate and the self-cleaning layer is disposed on the high albedo layer. In some embodiments, the photovoltaic system further comprises a retractable roller mounted on the base for retracting the self-cleaning albedo device into a roll. For example, in some embodiments, the self-cleaning albedo device has an open configuration and a closed configuration. The self-cleaning albedo device is rolled up in the retractable roller when the self-cleaning albedo device is in the closed position. Further, the self-cleaning albedo device is extended in a downward gradient away from the base when the self-cleaning albedo device is in the open position.

5.4 Exemplary Semiconductor Junctions

Figure 5A:
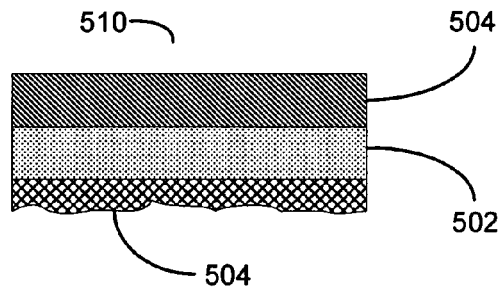
FIG. 5 depicts various junction types in photovoltaic cell systems in accordance with embodiments of the present invention.

Referring to FIG. 5A, in one embodiment, semiconductor junction 510 is a heterojunction between an absorber layer 502, disposed on conductive core 510, and a junction partner layer 510, disposed on absorber layer 502. Layers 502 and 504 are composed of different semiconductors with different band gaps and electron affinities such that junction partner layer 510 has a larger band gap than absorber layer 502. In some embodiments, absorber layer 502 is p-doped and junction partner layer 510 is n-doped. In such embodiments, TCO layer 512 is $n^+$-doped. In alternative embodiments, absorber layer 502 is n-doped and junction partner layer 510 is p-doped. In such embodiments, TCO layer 512 is $p^+$-doped.

In some embodiments, the semiconductors listed in Pandey, 1996, *Handbook of semiconductor Electrodeposition*, Marcel Dekker Inc., Appendix 5, which is hereby incorporated herein by reference in its entirety, are used to form semiconductor junction 510.

5.4.1 Thin-film Semiconductor Junctions based on Copper Indium Diselenide and other Type I-III-VI Materials Continuing to refer to FIG. 5A, in some embodiments, absorber layer 502 is a group I-III-VI$_2$ compound such as copper indium di-selenide (CuInSe$_2$; also known as CIS). In some embodiments, absorber layer 502 is a group I-III-VI$_2$ ternary compound selected from the group consisting of CdGeAs$_2$, ZnSnAs$_2$, CuInTe$_2$, AgInTe$_2$, CuInSe$_2$, CuGaTe$_2$, ZnGeAs$_2$, CdSnP$_2$, AgInSe$_2$, AgGaTe$_2$, CuInS$_2$, CdSiAs$_2$, ZnSnP$_2$, CdGeP$_2$, ZnSnAs$_2$, CuGaSe$_2$, AgGaSe$_2$, AgInS$_2$, ZnGeP$_2$, ZnSiAs$_2$, ZnSiP$_2$, CdSiP$_2$, or CuGaS$_2$ of either the p-type or the n-type when such compound is known to exist.

In some embodiments, junction partner layer 510 is CdS, ZnS, ZnSe, or CdZnS. In one embodiment, absorber layer 502 is p-type CIS and junction partner layer 510 is n-type CdS, ZnS, ZnSe, or CdZnS. Such semiconductor junctions 510 are described in Chapter 6 of Bube, 1998, *Photovoltaic Materials*, Imperial College Press, London, which is hereby incorporated herein by reference in its entirety.

In some embodiments, absorber layer 502 is copper-indium-gallium-diselenide (CIGS). In some embodiments, absorber layer 502 is copper-indium-gallium-diselenide (CIGS) and junction partner layer 510 is CdS, ZnS, ZnSe, or CdZnS. In some embodiments, absorber layer 502 is p-type CIGS and junction partner layer 510 is n-type CdS, ZnS, ZnSe, or CdZnS.

Figure 5B:
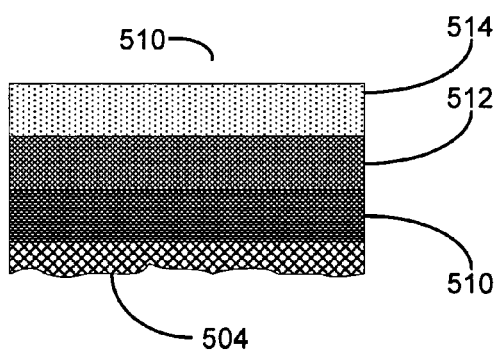

5.4.2 Semiconductor Junctions based on Amorphous Silicon or Polycrystalline Silicon In some embodiments, referring to FIG. 5B, semiconductor junction 510 comprises amorphous silicon. In some embodiments, this is an n/n type heterojunction. For example, in some embodiments, layer 514 comprises SnO$_2$(Sb), layer 512 comprises undoped amorphous silicon, and layer 510 comprises n+ doped amorphous silicon.

In some embodiments, semiconductor junction 510 is a p-i-n type junction. For example, in some embodiments, layer 514 is p$^+$doped amorphous silicon, layer 512 is undoped amorphous silicon, and layer 510 is n$^+$amorphous silicon. Such semiconductor junctions 510 are described in Chapter 3 of Bube, *Photovoltaic Materials,* 1998, Imperial College Press, London, which is hereby incorporated herein by reference in its entirety.

In some embodiments of the present invention, semiconductor junction 510 is based upon thin-film polycrystalline. Referring to FIG. 5B, in one example in accordance with such embodiments, layer 510 is a p-doped polycrystalline silicon, layer 512 is depleted polycrystalline silicon and layer 514 is n-doped polycrystalline silicon. Such semiconductor junctions are described in Green, 1995, *Silicon Solar Cells: Advanced Principles & Practice*, Centre for Photovoltaic Devices and Systems, University of New South Wales, Sydney; and Bube, 1998, *Photovoltaic Materials*, pp. 57-66, Imperial College Press, London, which is hereby incorporated herein by reference in its entirety.

In some embodiments of the present invention, semiconductor junctions 510 based upon p-type microcrystalline Si:H and microcrystalline Si:C:H in an amorphous Si:H photovoltaic cell are used. Such semiconductor junctions are described in Bube, 1998, *Photovoltaic Materials*, pp. 66-67, Imperial College Press, London, and the references cited therein, which is hereby incorporated herein by reference in its entirety.

5.4.3 Semiconductor Junctions based on Gallium Arsenide and other Type III-V Materials In some embodiments, semiconductor junctions 510 are based upon gallium arsenide (GaAs) or other III-V materials such as InP, AlSb, and CdTe. GaAs is a direct-band gap material having a band gap of 1.43 eV and can absorb 97% of AM1 radiation in a thickness of about two microns. Suitable type III-V junctions that can serve as semiconductor junctions 510 of the present invention are described in Chapter 4 of Bube, 1998, *Photovoltaic Materials*, Imperial College Press, London, which is hereby incorporated herein by reference in its entirety.

Furthermore, in some embodiments semiconductor junction 510 is a hybrid multijunction photovoltaic cells such as a GaAs/Si mechanically stacked multijunction as described by Gee and Virshup, 1988, 20$^{th}$ *IEEE Photovoltaic Specialist Conference*, IEEE Publishing, New York, p. 754, which is hereby incorporated herein by reference in its entirety, a GaAs/CuInSe$_2$ MSMJ four-terminal device, consisting of a GaAs thin film top cell and a ZnCdS/CuInSe$_2$ thin bottom cell described by Stanbery et al., 19$^{th}$ *IEEE Photovoltaic Specialist Conference*, IEEE Publishing, New York, p. 280, and Kim et al., $_{20}$$^{th}$ *IEEE Photovoltaic Specialist Conference*, IEEE Publishing, New York, p. 1487, each of which is hereby incorporated herein by reference in its entirety. Other hybrid multijunction photovoltaic cells are described in Bube, 1998, *Photovoltaic Materials*, pp. 131-132, Imperial College Press, London, which is hereby incorporated herein by reference in its entirety.

Figure 5C:
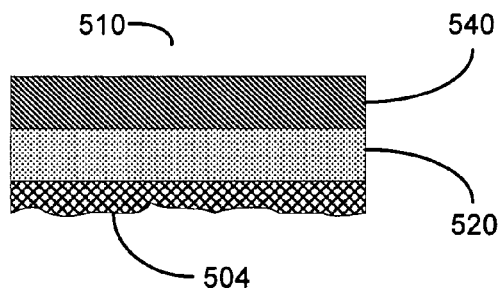

5.4.4 Semiconductor Junctions based on Cadmium Telluride and other Type II-VI Materials In some embodiments, semiconductor junctions 510 are based upon II-VI compounds that can be prepared in either the n-type or the p-type form. Accordingly, in some embodiments, referring to FIG. 5C, semiconductor junction 510 is a p-n heterojunction in which layers 520 and 540 are any combination set forth in the following table or alloys thereof.

| Layer 520 | Layer 540 |
| --- | --- |
| n-CdSe | p-CdTe |
| n-ZnCdS | p-CdTe |
| n-ZnSSe | p-CdTe |
| p-ZnTe | n-CdSe |
| n-CdS | p-CdTe |
| n-CdS | p-ZnTe |
| p-ZnTe | n-CdTe |
| n-ZnSe | p-CdTe |
| n-ZnSe | p-ZnTe |
| n-ZnS | p-CdTe |
| n-ZnS | p-ZnTe |

Methods for manufacturing semiconductor junctions 510 are based upon II-VI compounds are described in Chapter 4 of Bube, 1998, *Photovoltaic Materials*, Imperial College Press, London, which is hereby incorporated herein by reference in its entirety.

5.4.5 Semiconductor Junctions based on Crystalline Silicon

Figure 5D:
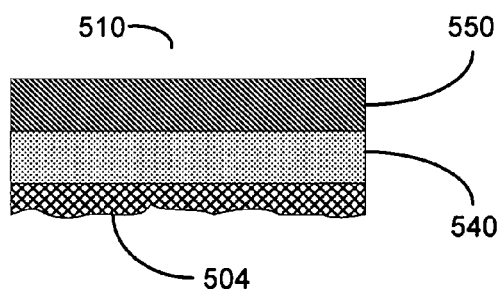

While semiconductor junctions 510 that are made from thin semiconductor films are preferred, the invention is not so limited. In some embodiments semiconductor junctions 510 is based upon crystalline silicon. For example, referring to FIG. 5D, in some embodiments, semiconductor junction 510 comprises a layer of p-type crystalline silicon 540 and a layer of n-type crystalline silicon 550. Methods for manufacturing crystalline silicon semiconductor junctions 510 are described in Chapter 2 of Bube, *Photovoltaic Materials,* 1998, Imperial College Press, London, which is which is hereby incorporated herein by reference in its entirety.

5.5 Photovoltaic Cell Types

The self-cleaning surfaces of the present invention can be used with a wide variety of photovoltaic types including, but not limited to, wire-shaped, tube-shaped and flat panel-shaped. The self-cleaning surfaces of the present invention can be used with mono-facial, bi-facial, and multi-facial photovoltaic cells. The self-cleaning surfaces of the present invention can be used with moveable as well as stationary photovoltaic cells. The self-cleaning surfaces of the present invention can be used with photovoltaic cells having any of the junction types described in Section 5.4. Furthermore, the photovoltaic cells of the present invention can be used with photovoltaic cell concentrators.

There is no limit to the types and architectures of photovoltaic cells 210 (FIG. 2) that can benefit from the self-cleaning layers 208 and 306 of the present invention. Representative photovoltaic cells 210 include, but are not limited to any of the photovoltaic cells described in U.S. Pat. Nos. 6,846,984; 6,830,740; 6,825,409; 6,818,819; 6,809,252; 6,803,515; 6,802,926; 6,787,692; 6,784,358; 6,750,394; 6,746,709; 6,743,974; 6,717,519; 6,696,739; 6,692,981; 6,689,950; 6,683,361; 6,676,459; 6,667,434; 6,664,169; 6,660,930; 6,639,143; 6,638,788; 6,635,817; 6,617,508; 6,613,973; 6,606,830; 6,605,881; 6,593,522; 6,581,589; 6,566,595; 6,566,159; 6,563,289; 6,555,443; 6,552,259; 6,552,258; 6,548,751; 6,545,211; 6,541,696; 6,541,693; 6,540,178; 6,534,704; 6,534,334; 6,525,264; 6,525,262; 6,524,880; 6,521,827; 6,521,826; 6,521,823; 6,521,821; 6,518,944; 6,515,216; 6,512,171; and 6,509,204, each of which is hereby incorporated herein by reference in its entirety.

Still another type of photovoltaic cell that can benefit from the self-cleaning layers of the present invention are the type of photovoltaic cells found in U.S. Pat. No. 6,762,359 B2 to Asia et al., which is hereby incorporated herein by reference in its entirety, in which a photovoltaic cell including a p-type layer and an n-type layer is disclosed. Still another type of photovoltaic cell that can benefit from the self-cleaning layers of the present invention is the type of photovoltaic cells found in U.S. Pat. No. 3,976,508 to Mlavsky, which is hereby incorporated herein by reference in its entirety, in which a tubular photovoltaic cell comprising a cylindrical silicon tube of n-type conductivity that has been subjected to diffusion of boron into its outer surface to form an outer p-conductivity type region 4 and thus a p-n junction. Still another type of photovoltaic cell that can benefit from the self-cleaning layers of the present invention are the type of photovoltaic cells found in U.S. Pat. No. 3,990,914 to Weinstein and Lee, which is hereby incorporated herein by reference in its entirety, in which another form of tubular photovoltaic cell is disclosed. Still another type of photovoltaic cell that can benefit from the self-cleaning layers of the present invention are the type of photovoltaic cells found in Japanese Patent Application Kokai Publication Number S59-125670, Toppan Printing Company, published Jul. 20, 1984 (hereinafter "S59-125670"), which is hereby incorporated herein by reference in its entirety, in which a rod-shaped photovoltaic cell is disclosed. Yet another type of photovoltaic cell that can benefit from the self-cleaning layers of the present invention is the type of photovoltaic cells found in German Unexamined Patent Application DE 43 39 547 A1 to Twin Solar-Technik Entwicklungs-GmbH, published May 24, 1995, (hereinafter "Twin Solar"), which is hereby incorporated herein by reference in its entirety, in which a plurality of rod-shaped photovoltaic cells arranged in a parallel manner inside a transparent sheet, which forms the body of the photovoltaic cell.

5.6 Additional Embodiments

One aspect of the invention provides a photovoltaic cell system comprising a plurality of photovoltaic cell assemblies. Each assembly in the plurality of photovoltaic cell assemblies comprises a front side and a back side. Each of these front sides and back sides is configured to receive electromagnetic energy. Each of the photovoltaic assemblies in the plurality of photovoltaic assemblies is configured to convert electromagnetic energy into an electrical current. Each respective photovoltaic cell assembly in the plurality of photovoltaic cell assemblies further comprises a first self-cleaning layer disposed on the corresponding front side of the respective photovoltaic cell assembly. In some embodiments, each respective photovoltaic cell assembly in the plurality of photovoltaic cell assemblies further comprises a second self-cleaning layer disposed on the corresponding back side of the respective photovoltaic cell assembly. In some embodiments, the first self-cleaning layer and/or the second self-cleaning layer is one or more layers of photocatalytic coating, nano-particles and/or titanium oxide. In some embodiments, the first self-cleaning layer and/or the second self-cleaning layer is a hydrophobic layer.

6. References Cited

All references cited herein are incorporated herein by reference in their entirety and for all purposes to the same extent as if each individual publication or patent or patent application was specifically and individually indicated to be incorporated by reference in its entirety for all purposes.

Many modifications and variations of this invention can be made without departing from its spirit and scope, as will be apparent to those skilled in the art.

What is claimed:

1. A photovoltaic cell system, comprising:
   a photovoltaic cell assembly, wherein the photovoltaic cell assembly comprises a front side, wherein said front side is configured to receive electromagnetic energy, and wherein said photovoltaic assembly is configured to convert electromagnetic energy into an electrical current; and
   an albedo surface configured to reflect electromagnetic energy on said photovoltaic cell assembly, wherein said albedo surface comprises:
   a high albedo layer; and
   a self-cleaning layer disposed on said high albedo layer, wherein said high albedo layer is self-cleaning.

2. The photovoltaic cell system of claim 1, wherein the self-cleaning layer comprises a photocatalytic material.

3. The photovoltaic cell system of claim 1, wherein the self-cleaning layer comprises Ti-hydroxyapetite.

4. The photovoltaic cell system of claim 1, wherein the self-cleaning layer comprises anatase $TiO_2$, brookitein $TiO_2$ or rutile $TiO_2$.

5. The photovoltaic cell system of claim 1, wherein the self-cleaning layer comprises between 1 percent $TiO_2$ and 90 percent $TiO_2$ by weight.

6. The photovoltaic cell system of claim 1, wherein the self-cleaning layer comprises ZnO, $SnO_2$, $SrTiO_3$, $WO_3$, $Bi_2O_3$, or $Fe_2O_3$.

7. The photovoltaic cell system of claim 1, wherein the self-cleaning layer is formed from perotitanium solution or perox-modified anatase sol.

8. The photovoltaic cell system of claim 1, wherein the self-cleaning layer comprises a plurality of nano-particles.

9. The photovoltaic cell system of claim 8, wherein the plurality of nano-Particles comprises $SiO_2$, $TiO_2$, $Al_2O_3$, $ZrO_2$ or $SnO_2$, or silica.

10. The photovoltaic cell system of claim 1, wherein the self-cleaning layer comprises polytetrafluoroethylene or polychlorotrifluoroethylene.

11. The photovoltaic cell system of claim 1, wherein the self-cleaning layer comprises $(100-X)CaF_2 —(X)TiO_2$, wherein X is the molar percentage of $TiO_2$ and X is between 1 percent and 50 percent.

12. The photovoltaic cell system of claim 1, wherein the self-cleaning layer comprises a composite of $CaF_2$ and $TiO_2$.

13. The photovoltaic cell system of claim 1, wherein the self-cleaning layer comprises a photocatalytic oxide and a resin.

14. The photovoltaic cell system of claim 13, wherein the resin comprises a silicone resin or a fluororesin.

15. The photovoltaic cell system of claim 13, wherein the resin comprises ethyltrimethoxysilane, methyltriethoxysilane, methyltrichlorosilane, methyltribromosilane, methyltriisopropoxysilane, methyl-tri-t-butoxysilane, ethyltrimethoxysilane, ethyltriethoxysilane, ethyltrichlorosilane, ethyltribromosilane, ethyltriisopropoxysilane, ethyl-tri-t-butoxysilane, n-propyltrimethoxysilane, n-propyltriethoxysilane, n-propyltrichlorosilane, n-propyltribromosilane, n-propyltriisopropoxysilane, n-propyl-tri-t-butoxysilane, n-hexyltrimethoxysilane, n-hexyltriethoxysilane, n-hexytrichlorosilane, n-hexyltribromosilane, n-hexyltriisopropoxysilane, n-hexyl-tri-t-butoxysilane, n-decyltrimethoxysilane, n-decyltriethoxysilane, n-decyltrichlorosilane, n-decyltribromosilane, n-decyltriisopropoxysilane, n-decyltri-t-butoxysilane, n-octatrimethoxysilane, n-octatriethoxysilane, n-octatrichlorosilane, n-octatribromosilane, n-octatriisopropoxysilane, n-octa-tri-t-butoxysilane, phenyltrimethoxysilane, phenyltriethoxysilane, phenyltrichlorosilane, phenyltribromosilane, phenyltriisopropoxysilane, phenyl-t-butoxysilane, dimethyldichlorosilane, dimethyldibromosilane, dimethyldimethoxysilane, dimethyldiethoxysilane, diphenyldichlorosilane, diphenyldibromosilane, diphenyldimethoxysilane, diphenyldiethoxysilane, phenylmethyldichlorosilane, phenylmethyldibromosilane, phenylmethyldimethoxysilane, phenylmethyldiethoxysilane, vinyltrichlorosilane, vinyltribromosilane, vinyltrimethoxysilane, vinyltriethoxysilane, vinyltriisopropoxysilane, vinyl-tri-t-butoxysilane, trifluoropropyltrichlorosilane, trifluoropropyltribromosilane, trifluoropropyltrimethoxysilane, trifluoropropyltriethoxysilane, trifluoropropyltriisopropoxysilane, trifluoropropyl-tri-t-butoxysilane, γ-glycidoxypropylmethyldimethoxysilane, γ-glycidoxypropylmethyldiethoxysilane, γ-glycidoxypropyltrimethoxysilane, γ-glycidoxypropyltriethoxysilane, γ-glycidoxypropyltriisopropoxysilane, γ-glycidoxypropyl-tri-t-butoxysilane, γ-methacryloxypropylmethyldimethoxysilane, γ-methacryloxypropylmethyldiethoxysilane, γ-methacryloxypropyltrimethoxysilane, γ-methacryloxypropyltriethoxysilane, γ-methacryloxypropyltriisopropoxysilane, γ-methacryloxypropyl-tri-t-butoxysilane, γ-aminopropylmethyldimethoxysilane, γ-aminopropylmethyldiethoxysilane, γ-aminopropyltrimethoxysilane, γ-aminopropyltriethoxysilane, γ-aminopropyltriisopropoxysilane, γ-aminopropyl-tri-t-butoxysilane, γ-mercaptopropylmethyldimethoxysilane, γ-mercaptopropylmethyldiethoxysilane, γ-mercaptopropyltrimethoxysilane, γ-mercaptopropyltriethoxysilane, γ-mercaptopropyltriisopropoxysilane, γ-mercaptopropyl-tri-t-butoxysilane, β(3,4-poxycyclohexyl)ethyltrimethoxysilane, β(3,4-epoxycyclohexyl)ethyltriethoxysilane, or any combination thereof.

16. The photovoltaic cell system of claim 13, wherein the resin comprises a fluororesin and wherein the fluororesin comprises polytetrafluoroethylene, polyvinylidene fluoride, polyvinyl fluoride, polychlorotrifluoroethylene, tetrafluoroethylene/hexafluoropropylene copolymer, ethylene/tetrafluoroethylene copolymer, ethylene/chlorotrifluoroethylene copolymer, tetrafluoroethylene/perfluoroalkyl vinyl ether copolymer, perfluorocyclo polymer, vinyl ether/fluoroolefin copolymer, vinyl ester/fluoroolefin copolymer, tetrafluoroethylene/vinyl ether copolymer, chlorotrifluoroethylene/vinyl ether copolymer, urethane-crosslinked tetrafluoroethylene, epoxy-crosslinked tetrafluoroethylene, acryl-crosslinked tetrafluoroethylene, melamine-crosslinked tetrafluoroethylene, or any combination thereof.

17. The photovoltaic cell system of claim 1, wherein a photovoltaic cell assembly in said plurality of photovoltaic cell assemblies comprises a back side that is configured to receive electromagnetic energy.

18. The photovoltaic cell system of claim 1, wherein the photovoltaic cell assembly is mono-facial or bi-facial.

* * * * *